(12) United States Patent
Kao et al.

(10) Patent No.: US 12,165,997 B2
(45) Date of Patent: Dec. 10, 2024

(54) SEMICONDUCTOR DEVICE AND METHOD OF MANUFACTURING THE SAME

(71) Applicant: Taiwan Semiconductor Manufacturing Company, Ltd., Hsin-Chu (TW)

(72) Inventors: Ching-Hung Kao, Tainan (TW); Kuei-Yu Deng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 266 days.

(21) Appl. No.: 17/711,705

(22) Filed: Apr. 1, 2022

(65) Prior Publication Data

US 2023/0026305 A1    Jan. 26, 2023

Related U.S. Application Data

(60) Provisional application No. 63/222,196, filed on Jul. 15, 2021.

(51) Int. Cl.
*H01L 23/00*    (2006.01)

(52) U.S. Cl.
CPC .............. *H01L 24/05* (2013.01); *H01L 24/06* (2013.01); *H01L 24/03* (2013.01); *H01L 2224/03001* (2013.01); *H01L 2224/0345* (2013.01); *H01L 2224/03452* (2013.01); *H01L 2224/0346* (2013.01); *H01L 2224/0391* (2013.01); *H01L 2224/05013* (2013.01); *H01L 2224/05073* (2013.01); *H01L 2224/05078* (2013.01); *H01L 2224/05124* (2013.01);
(Continued)

(58) Field of Classification Search
CPC ......... H01L 24/05; H01L 24/06; H01L 24/03; H01L 2224/03001; H01L 2224/0345; H01L 2224/03452; H01L 2224/0346; H01L 2224/0391; H01L 2224/05013; H01L 2224/05073; H01L 2224/05078; H01L 2224/05124; H01L 2224/05147; H01L 2224/05546; H01L 2224/05553; H01L 2224/05557; H01L 2224/05562; H01L 23/5226
See application file for complete search history.

(56) References Cited

U.S. PATENT DOCUMENTS 8,772,109 B2  7/2014  Colinge
8,785,285 B2  7/2014  Tsai et al.
(Continued)

FOREIGN PATENT DOCUMENTS

TW    201709458 A    3/2017
TW    202125839 A    7/2021

*Primary Examiner* — Douglas W Owens
(74) *Attorney, Agent, or Firm* — HAYNES AND BOONE, LLP

(57) ABSTRACT

A semiconductor device and method of manufacturing the same are provided. The semiconductor device includes an interconnect structure on a substrate; a passivation layer disposed on the interconnect structure; a first via, a second via and a third via disposed in the passivation layer and connected to the interconnect structure, each of the first, second and third vias has an elongated shape longitudinally oriented along a first direction; and a first pad longitudinally oriented along the first direction and landing on the first, second and third vias.

20 Claims, 21 Drawing Sheets

(52) U.S. Cl.
CPC .............. *H01L 2224/05147* (2013.01); *H01L 2224/05546* (2013.01); *H01L 2224/05553* (2013.01); *H01L 2224/05557* (2013.01); *H01L 2224/05562* (2013.01); *H01L 2224/05624* (2013.01); *H01L 2224/05647* (2013.01); *H01L 2224/0603* (2013.01); *H01L 2924/35121* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2007/0052092 A1* | 3/2007 | Kao .................. H01L 24/02 257/734 |
| 2007/0205508 A1* | 9/2007 | Hsia .................. H01L 24/05 257/734 |
| 2022/0223589 A1* | 7/2022 | Wu ................ H01L 29/66545 |

* cited by examiner

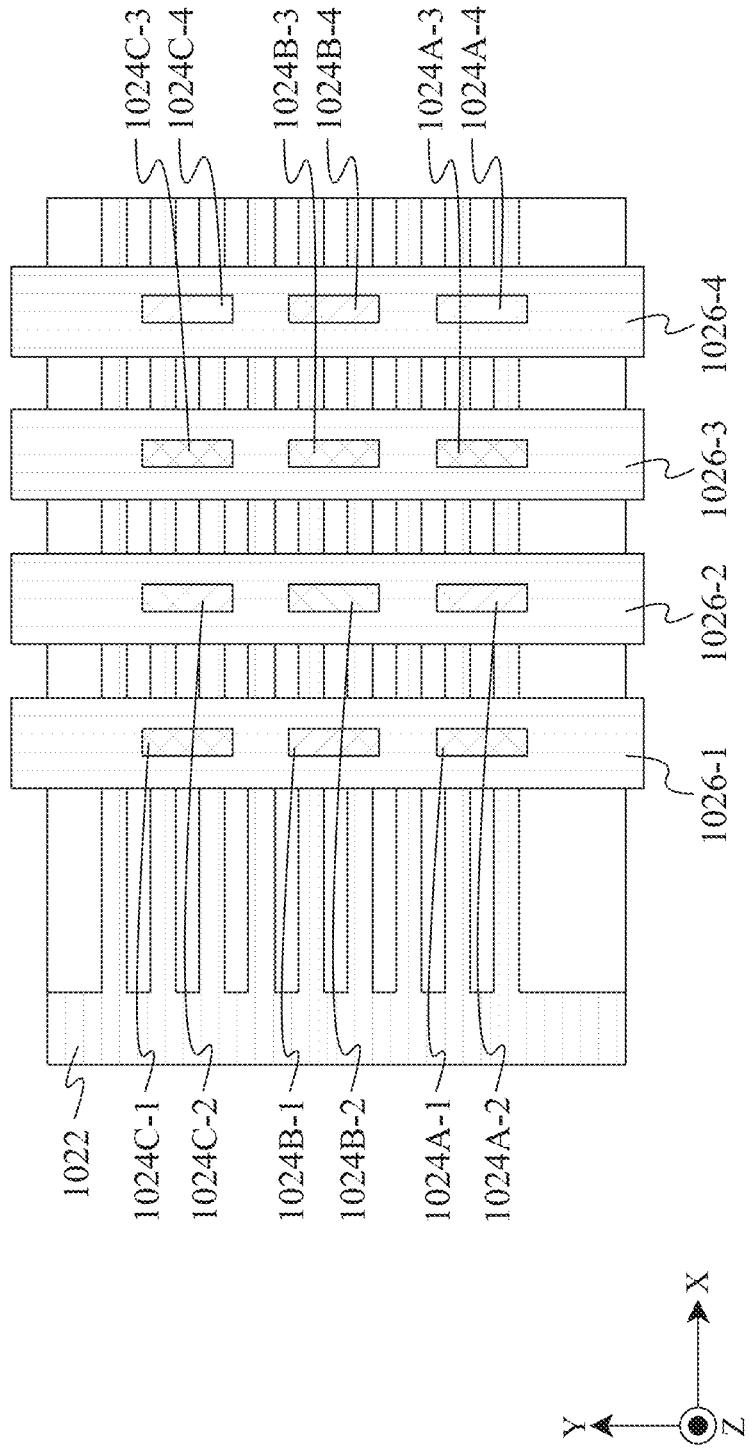

SEMICONDUCTOR DEVICE AND METHOD OF MANUFACTURING THE SAME

PRIORITY CLAIM AND CROSS-REFERENCE

This application claims priority to U.S. Provisional Application No. 63/222,196 filed Jul. 15, 2021, the disclosure of which is hereby incorporated by reference in its entirety.

BACKGROUND

The semiconductor integrated circuit (IC) industry has experienced rapid growth. Technological advances in IC materials and design have produced generations of ICs in which each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. For the ever-decreasing geometry size of ICs, physical stress due to any action causing temperature change may be critical.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 16 is a top view of a semiconductor device, in accordance with some embodiments of the present disclosure.

DETAILED DESCRIPTION

Figure 1:
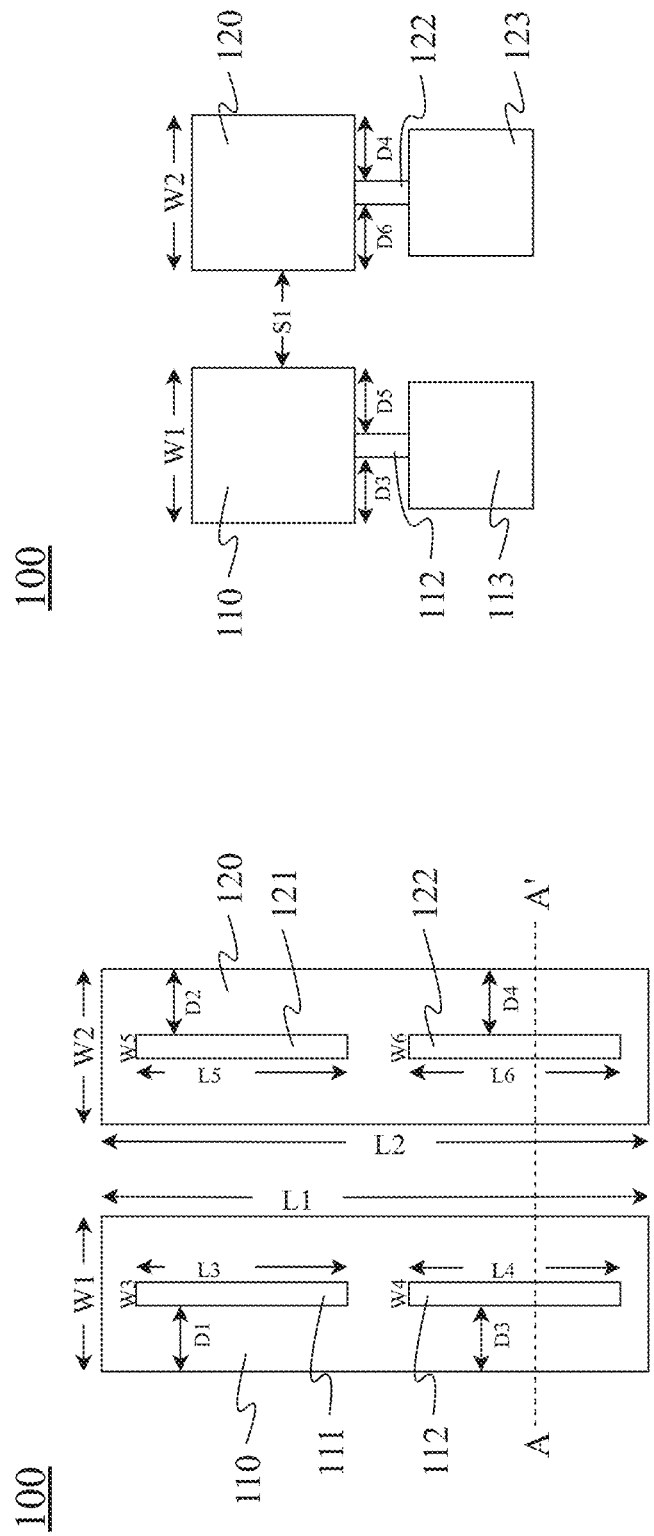
FIG. 1A is a top view of a semiconductor device, in accordance with some embodiments of the present disclosure.
FIG. 1B is a cross-section of the semiconductor device of FIG. 1A along line AA', in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

Metal pads, such as soldering pads or wire bonding pads, have been used for various IC applications. In order to function properly, a metal pad should have sufficient size and strength to withstand physical stress from such actions as soldering or wire bonding. However, the ever-decreasing geometry size of ICs has further dictated a reduction in the size of metal pads, and often conventional metal pads and passivation layers may suffer from problems such as peeling or cracking in layers surrounding the metal pads.

The present disclosure provides a novel semiconductor structure including well-designed vias to provide support for a metal pad.

FIG. 1A is a top view of a semiconductor device 100 and FIG. 1B is a sectional view of the semiconductor device 100, in accordance with some embodiments of the present disclosure.

The semiconductor device 100 includes pads 110 and 120 and vias 111, 112, 121, and 122, which are all conductive features. The pads 110 and 120 may comprise aluminum, copper, an aluminum copper alloy, the like, or a combination thereof. The vias 111, 112, 121, and 122 may comprise aluminum, copper, an aluminum copper alloy, the like, or a combination thereof. In some embodiments, the pad (such as 110 and 120) and vias (such as 111, 112, 121 and 122) may be formed in a single process (e.g. a deposition process).

In FIG. 1A, the pad 110 is landing on and connecting with the vias 111 and 112. The pad 120 is landing on and connecting with the vias 121 and 122. The vias 111 and 112 may be formed at a level lower than that of pad 110. The vias 121 and 122 may be formed at a level lower than that of pad 120. The vias (such as 111, 112, 121, and 122) are formed in a passivation layer, and the pads (such as 110 and 120) are landing on the respective vias and providing to bonding features. The pads (such as 110 and 120) are electrically connected to the interconnect structure (such as conductive features 113 and 123 of the interconnect structure, respectively) through respective vias. In the disclosed embodiment, the vias 111 and 112 have elongated shapes and are longitudinally oriented along a first direction; and the pad 110 has an elongated shape and is longitudinally oriented along the first direction as well. Furthermore, the vias 111 and 112 are aligned along the first direction and are spaced away from each other with a distance along the first direction. The pad 110 is landing on both vias 111 and 112. In furtherance of the embodiment, the vias 111 and 112 are placed in the central location such that the collective structure of the pad 110 and the vias 111 and 112 is symmetrically configured in a sectional view along the first direction and along a second direction that is orthogonal to the first direction. In the top view, the vias 111 and 112 are completely overlapped with the pad 110 with proper margins on all edges, particularly equal margins on opposite edges (such as D1, D2, D3 and D4), as illustrated in FIGS. 1A and 1B.

Figure 2:
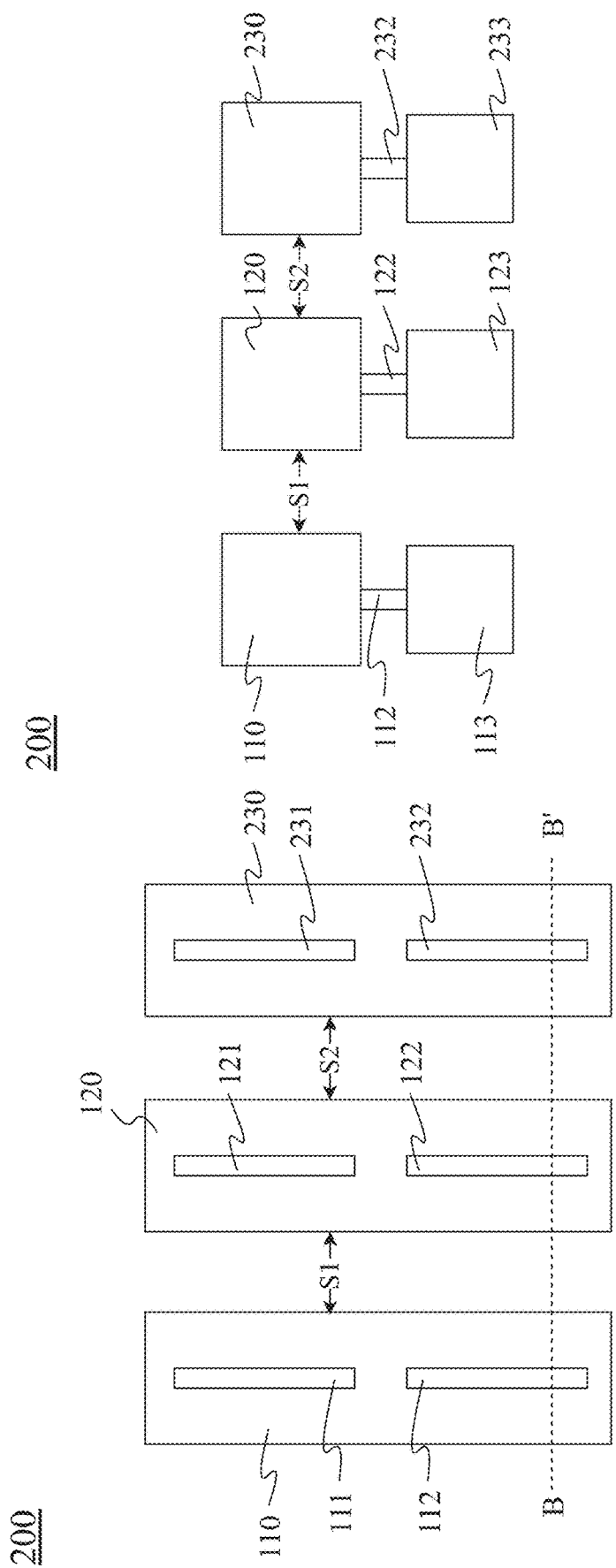
FIG. 2A is a top view of a semiconductor device, in accordance with some embodiments of the present disclosure.
FIG. 2B is a cross-section of the semiconductor device of FIG. 2A along line BB', in accordance with some embodiments of the present disclosure.

Such configuration of a pad with corresponding dual vias may be repeated along the second direction, such as those illustrated in FIGS. 1A/1B, or FIGS. 2A/2B. As described above, the vias 111 and 112 are aligned along the first direction and are spaced away from each other with a distance along the first direction. In some embodiments, the distance is reduced to zero such that vias 111 and 112 are merged into one elongated via 311 longitudinally oriented along the first direction, such as one illustrated in FIGS. 3A/3B.

Figure 4:
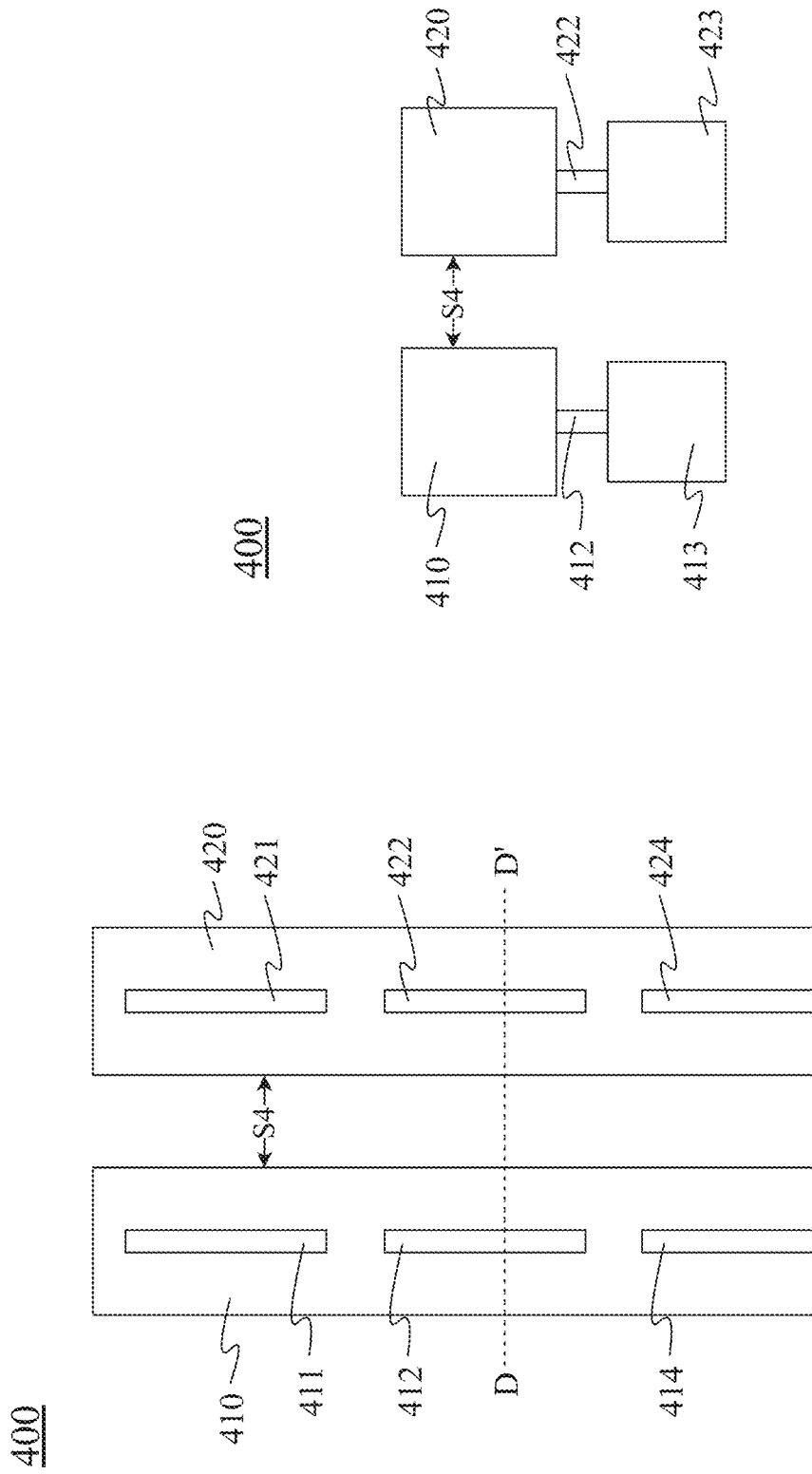
FIG. 4A is a top view of a semiconductor device, in accordance with some embodiments of the present disclosure.
FIG. 4B is a cross-section of the semiconductor device of FIG. 4A along line DD', in accordance with some embodiments of the present disclosure.

In some embodiments where both the pad and the corresponding vias are longitudinally oriented along the first direction, the pad is landing on three or more vias, such as one illustrated in FIGS. 4A/4B. Those vias are all aligned along the first direction. In furtherance of the embodiments, the configuration is symmetrical. For example, In the top view, the corresponding vias (such as 411, 412 and 414) are completely overlapped with the pad 410 with equal margins on opposite edges; and the corresponding vias (such as 411, 412 and 414) are equally spaced along the first direction.

By implementing the disclosed semiconductor structure in various embodiments, some of advantages described below may present. However, it is understood that different embodiments disclosed herein offer different advantages and that no particular advantage is necessarily required in all embodiments. As one example, the cracking or delamination is effectively eliminated or reduced while the contact areas of pads to vias are increased, and accordingly contact resistances are reduced.

For example, the semiconductor device 100 may be manufactured under a 28 nm process. In some embodiments, the width W1 of the pad 110 may be from 3.5 μm to 6 μm.

The width W2 of the pad 120 may be from 3.5 µm to 6 µm. The widths W1 and W2 may be substantially identical.

In some embodiments (e.g. semiconductor devices manufactured under a 28 nm process), the width W3 of the via 111 may be from 1 µm to 1.7 µm. In an embodiment, the width W3 may be 1.7 µm. The width W4 of the via 112 may be from 1 µm to 1.7 µm. In an embodiment, the width W4 may be 1.7 µm. The width W5 of the via 121 may be from 1 µm to 1.7 µm. In an embodiment, the width W5 may be 1.7 µm. The width W6 of the via 122 may be from 1 µm to 1.7 µm. In an embodiment, the width W6 may be 1.7 µm. The widths W3 and W4 may be substantially identical. The widths W5 and W6 may be substantially identical. The widths W3, W4, W5, and W6 may be substantially identical.

In some embodiments, the semiconductor device 100 may be manufactured under processes of different nanometers. In some embodiments, the ratio of W3 to W1 may be from 0.16 to 0.48. The ratio of W4 to W1 may be from 0.16 to 0.48. The ratio of W5 to W2 may be from 0.16 to 0.48. The ratio of W6 to W2 may be from 0.16 to 0.48. The widths W1 and W2 may be substantially identical. The widths W3 and W4 may be substantially identical. The widths W5 and W6 may be substantially identical. The widths W3, W4, W5, and W6 may be substantially identical. When the ratio of the width of the vias to the width of the pads (e.g. W3/W1, W4/W1, W5/W2, and W6/W2) is from 0.16 to 0.48, passivation cracking between the two pads may be effectively avoided.

In some embodiments (e.g. semiconductor devices manufactured under a 28 nm process), the length L1 of the pad 110 may be from 10 µm to 2000 µm. The length L2 of the pad 120 may be from 10 µm to 2000 µm. The lengths L1 and L2 may be substantially identical. When lengths L1 and L2 are substantially identical and pads 110 and 120 parallel, the parallel run length (PRL) of pad 110 and 120 may be from 10 µm to 2000 µm.

In some embodiments (e.g. semiconductor devices manufactured under a 28 nm process), the length L3 of the via 111 may be from 5 µm to 30 µm. In an embodiment, the length L3 may be 7.2 µm. The length L4 of the via 112 may be from 5 µm to 30 µm. In an embodiment, the length L4 may be 7.2 µm. The length L5 of the via 121 may be from 5 µm to 30 µm. In an embodiment, the length L5 may be 7.2 µm. The length L6 of the via 122 may be from 5 µm to 30 µm. In an embodiment, the length L6 may be 7.2 µm. The lengths L3 and L4 may be substantially identical. The lengths L5 and L6 may be substantially identical. The lengths L3, L4, L5, and L6 may be substantially identical.

In some embodiments, the ratio of W3 to L3 is not greater than 0.34. The ratio of W4 to L4 is not greater than 0.34. The ratio of W5 to L5 is not greater than 0.34. The ratio of W6 to L6 is not greater than 0.34. When the ratio of the width of the vias to the length of the vias (e.g. W3/L3, W4/L4, W5/L5, and W6/L6) is not greater than 0.34, passivation cracking between the two pads may be effectively avoided.

In FIG. 1A, the distance D1 may be measured from the left side of the via 111 to the left side of the pad 110 along the width (e.g. the width W1 or W3). The distance D1 along the width may be measured from the boundary of the via 111 to the boundary of the pad 110 on the same side (e.g. the left side). When the via 111 is located at the center of the pad 110 along the width, the distance between the right side of the via 111 and the right side of the pad 110 may be substantially identical to the distance D1. In some embodiments (e.g. semiconductor devices manufactured under a 28 nm process), the distance D1 may be from 0.9 µm (e.g. W1=3.5 µm, W3=1.7 µm) to 2.5 µm (e.g. W1=6 µm, W3=1 µm). In some embodiments, the ratio of D1 to W3 may be from 0.52 (e.g. D1=0.9 µm, W3=1.7 µm) to 2.5 (e.g. D1=2.5 µm, W3=1 µm). In some embodiments, the ratio of D1 to W1 may be from 0.25 (e.g. D1=0.9 µm, W1=3.5 µm) to 0.42 (e.g. D1=2.5 µm, W1=6 µm).

The distance D2 may be measured from the right side of the via 121 to the right side of the pad 120 along the width (e.g. the width W2 or W5). The distance D2 along the width may be measured from the boundary of the via 121 to the boundary of the pad 120 on the same side (e.g. the right side). When the via 121 is located at the center of the pad 120 along the width, the distance between the left side of the via 121 and the left side of the pad 120 may be substantially identical to the distance D2. In some embodiments (e.g. semiconductor devices manufactured under a 28 nm process), the distance D2 may be from 0.9 µm (e.g. W2=3.5 µm, W5=1.7 µm) to 2.5 µm (e.g. W2=6 µm, W5=1 µm). In some embodiments, the ratio of D2 to W5 may be from 0.52 (e.g. D2=0.9 µm, W5=1.7 µm) to 2.5 (e.g. D2=2.5 µm, W5=1 µm). In some embodiments, the ratio of D2 to W2 may be from 0.25 (e.g. D2=0.9 µm, W2=3.5 µm) to 0.42 (e.g. D2=2.5 µm, W2=6 µm).

The distance D3 may be measured from the left side of the via 112 to the left side of the pad 110 along the width (e.g. the width W1 or W4). The distance D3 along the width may be measured from the boundary of the via 112 to the boundary of the pad 110 on the same side (e.g. the left side). When the via 112 is located at the center of the pad 110 along the width, the distance between the right side of the via 112 and the right side of the pad 110 may be substantially identical to the distance D3. When vias 111 and 112 are aligned along the width, the distance D1 may be identical to the distance D3. In some embodiments (e.g. semiconductor devices manufactured under a 28 nm process), the distance D3 may be from 0.9 µm (e.g. W1=3.5 µm, W4=1.7 µm) to 2.5 µm (e.g. W1=6 µm, W4=1 µm). In some embodiments, the ratio of D3 to W4 may be from 0.52 (e.g. D3=0.9 µm, W4=1.7 µm) to 2.5 (e.g. D3=2.5 µm, W4=1 µm). In some embodiments, the ratio of D3 to W1 may be from 0.25 (e.g. D3=0.9 µm, W1=3.5 µm) to 0.42 (e.g. D3=2.5 µm, W1=6 µm).

The distance D4 may be measured from the right side of the via 122 to the right side of the pad 120 along the width (e.g. the width W2 or W6). The distance D4 along the width may be measured from the boundary of the via 122 to the boundary of the pad 120 on the same side (e.g. the right side). When the via 122 is located at the center of the pad 120 along the width, the distance between the left side of the via 122 and the left side of the pad 120 may be substantially identical to the distance D4. When vias 121 and 122 are aligned along the width, the distance D2 may be identical to the distance D4. In some embodiments (e.g. semiconductor devices manufactured under a 28 nm process), the distance D4 may be from 0.9 µm (e.g. W2=3.5 µm, W6=1.7 µm) to 2.5 µm (e.g. W2=6 µm, W6=1 µm). In some embodiments, the ratio of D4 to W6 may be from 0.52 (e.g. D4=0.9 µm, W6=1.7 µm) to 2.5 (e.g. D4=2.5 µm, W6=1 µm). In some embodiments, the ratio of D4 to W2 may be from 0.25 (e.g. D4=0.9 µm, W2=3.5 µm) to 0.42 (e.g. D4=2.5 µm, W2=6 µm).

In some embodiments, when D1/W3, D2/W5, D3/W4, and/or D4/W6 is from 0.52 to 2.5, passivation cracking between the pads 110 and 120 may be effectively avoided. In some embodiments, the D1/W1, D2/W2, D3/W1, and/or D4/W2 is from 0.25 to 0.42, passivation cracking between the pads 110 and 120 may be effectively avoided.

In some embodiments, the pad 110, the via 111, and the via 112 may be substantially identical to the pad 120, the via 121, and the via 122, respectively. The lengths L1 and L2 may be substantially identical. The lengths L3, L4, L5, and L6 may be substantially identical. The widths W1, W3, and W4 may be substantially identical to the widths W2, W5, and W6, respectively. The distances D1 and D2 may be substantially identical. The distances D3 and D4 may be substantially identical. The distances D1, D2, D3, and D4 may be substantially identical.

FIG. 1B is a cross-section of the semiconductor device 100 of FIG. 1A along line AA', in accordance with some embodiments of the present disclosure.

In FIG. 1B, the via 112 may be formed at a level lower than that of pad 110. The via 122 may be formed at a level lower than that of pad 120. In some embodiments, the pad 110 and via 112 may be formed in a single process (e.g. a deposition process). The pad 120 and via 122 may be formed in a single process (e.g. a deposition process).

FIG. 1B further shows the metal contacts 113 and 123. The metal contact 113 may be formed at a level lower than those of the via 112 and the pad 110. The metal contact 123 may be formed at a level lower than those of the via 122 and the pad 120. The pad 110 may be connected to the metal contact 113 through the via 112. The pad 110 may be connected to the metal contact 113 through the vias 111 and 112. The pad 120 may be connected to the metal contact 123 through the via 122. The pad 120 may be connected to the metal contact 123 through the vias 121 and 122. The metal contacts 113 and 123 may comprise copper, aluminum, aluminum copper, tungsten, nickel, the like, or a combination thereof. The metal contacts 113 and 123 may be ultra-thick metal contacts. The metal contacts 113 and 123 may be a part of a top metal layer in an interconnect structure. The interconnect structure includes metal lines distributed in multiple metal layers configured to connects various devices into an integrated circuit. The pads and vias are formed in the passivation layer disposed on the interconnect structure. In some embodiments, the passivation layer includes a silicon nitride (SiN) film and an un-doped silica glass (USG) film on the SiN film. In some embodiments, the passivation layer includes the first passivation layer 518 and the second passivation layer 520. In furtherance of the embodiments, the first passivation layer 518 includes a SiN film and an USG film on the SiN film. The second passivation layer 520 includes one USG film and one SiN film on the USG film.

In some embodiments, the passivation layer (e.g. passivation layer 518) may be between the pads 110 and 120 and the metal contacts 113 and 123; the passivation layer (e.g. passivation layer 518) may surround the vias 111, 112, 121, and 122. In some embodiments, a passivation layer (e.g. passivation layer 520) may cover and surround the pads 110 and 120.

In FIG. 1B, the pads 110 and 120 may be spaced apart by the spacing S1. In some embodiments (e.g. semiconductor devices manufactured under a 28 nm process), the spacing S1 may be not greater than 5 μm.

In FIG. 1B, the distance D3 may be measured from the left side of the via 112 to the left side of the pad 110 along the width (e.g. the direction of the width W1 or W4; W4 is not shown in FIG. 1B). The distance D5 may be measured from the right side of the via 112 to the right side of the pad 110 along the width. The distance D3 may be measured from the boundary of the via 112 to the boundary of the pad 110 on the left side. The distance D5 may be measured from the boundary of the via 112 to the boundary of the pad 110 on the right side.

In some embodiments (e.g. semiconductor devices manufactured under a 28 nm process), the distance D5 may be from 0.9 μm (e.g. W1=3.5 μm, W4=1.7 μm) to 2.5 μm (e.g. W1=6 μm, W4=1 μm). In some embodiments, the ratio of D5 to W4 may be from 0.52 (e.g. D5=0.9 μm, W4=1.7 μm) to 2.5 (e.g. D5=2.5 μm, W4=1 μm). In some embodiments, the ratio of D5 to W1 may be from 0.25 (e.g. D5=0.9 μm, W1=3.5 μm) to 0.42 (e.g. D5=2.5 μm, W1=6 μm). When the via 112 is located at the center of the pad 110 along the width, D3 and D5 may be substantially identical.

In FIG. 1B, the distance D4 may be measured from the right side of the via 122 to the right side of the pad 120 along the width (e.g. the direction of the width W2 or W6; W6 is not shown in FIG. 1B). The distance D6 may be measured from the left side of the via 122 to the left side of the pad 120 along the width (e.g. W2 or W6). The distance D4 may be measured from the boundary of the via 122 to the boundary of the pad 120 on the right side. The distance D6 may be measured from the boundary of the via 122 to the boundary of the pad 120 on the left side.

In some embodiments (e.g. semiconductor devices manufactured under a 28 nm process), the distance D6 may be from 0.9 μm (e.g. W2=3.5 μm, W6=1.7 μm) to 2.5 μm (e.g. W2=6 μm, W6=1 μm). In some embodiments, the ratio of D6 to W6 may be from 0.52 (e.g. D6=0.9 μm, W6=1.7 μm) to 2.5 (e.g. D6=2.5 μm, W6=1 μm). In some embodiments, the ratio of D6 to W2 may be from 0.25 (e.g. D6=0.9 μm, W2=3.5 μm) to 0.42 (e.g. D6=2.5 μm, W2=6 μm). When the via 122 is located at the center of the pad 120 along the width, D4 and D6 may be substantially identical.

In some embodiments, the pad 110, the via 112, and the metal contact 113 may be substantially identical to the pad 120, the via 122, and the metal contact 123, respectively. The widths W1 and W2 may be substantially identical. The distances D3 and D4 may be substantially identical. The distances D5 and D6 may be substantially identical. The distances D3, D4, D5, and D6 may be substantially identical.

FIG. 2A is a diagram of a layout of a semiconductor device 200, in accordance with some embodiments of the present disclosure.

The semiconductor device 200 includes pads 110, 120, and 230 and vias 111, 112, 121, 122, 231, and 232. Compared with the semiconductor device 100 of FIG. 1A, the semiconductor device 200 further includes the pad 230 and the vias 231 and 232. The pad 230 may comprise aluminum, copper, an aluminum copper alloy, the like, or a combination thereof. The vias 231 and 232 may comprise aluminum, copper, an aluminum copper alloy, the like, or a combination thereof. In some embodiments, the pad 230 and vias 231 and 232 may be formed in a single process (e.g. a deposition process). The pad 230 may connect with the vias 231 and 232. The vias 231 and 232 may be formed at a level lower than that of pad 230.

Similar to the semiconductor device 100, the semiconductor device 200 may be manufactured under a 28 nm process. In some embodiments, the width of the pad 230 may be from 3.5 μm to 6 μm. The widths of pads 110, 120, and 230 may be substantially identical. Similar to the semiconductor device 100, the width of the via 231 may be from 1 μm to 1.7 μm; the width of the via 232 may be from 1 μm to 1.7 μm. In an embodiment, the width of the vias 231 and 232 may be 1.7 μm. The widths of the via 231 and 232 may be substantially identical. The widths of the vias 111, 112, 121, 122, 231, and 232 may be substantially identical. In some embodiments, when the ratio of the width of the vias to the width of the pads is from 0.16 to 0.48, passivation cracking between two pads may be effectively avoided.

Similar to the semiconductor device 100, the length of the pad 230 may be from 10 µm to 2000 µm. The lengths of the pads 110, 120, and 230 may be substantially identical. When lengths of the pads 110, 120, and 230 are substantially identical and pads 110, 120, and 230 parallel, the parallel run length (PRL) of the pads 110, 120, and 230 may be from 10 µm to 2000 µm.

Similar to the semiconductor device 100, the length of the via 231 may be from 5 µm to 30 µm; the length of the via 232 may be from 5 µm to 30 µm. In an embodiment, the lengths of the vias 231 and 232 may be 7.2 µm. The lengths of the vias 231 and 232 may be substantially identical. The lengths of the vias of 111, 112, 121, 122, 231, and 232 may be substantially identical. In some embodiments, when the ratio of the width of the vias to the length of the vias is not greater than 0.34, passivation cracking between the two pads may be effectively avoided.

In FIG. 2A, the pads 110 and 120 may be spaced apart by the spacing S1. In some embodiments (e.g. semiconductor devices manufactured under a 28 nm process), the spacing S1 may be not greater than 5 µm. The pads 120 and 230 may be spaced apart by the spacing S2. In some embodiments (e.g. semiconductor devices manufactured under a 28 nm process), the spacing S2 may be not greater than 5 µm.

FIG. 2B is a cross-section of the semiconductor device 200 of FIG. 2A along line BB', in accordance with some embodiments of the present disclosure.

Similar to the semiconductor device 100, the metal contact 233 may be formed at a level lower than those of the via 232 and the pad 230. The pad 230 may be connected to the metal contact 233 through the via 232. The metal contact 233 may comprise copper, aluminum, aluminum copper, tungsten, nickel, the like, or a combination thereof. The metal contacts 113, 123, and 233 may be ultra-thick metal contacts. The metal contacts 113, 123, and 233 may be a part of a top metal layer in a semiconductor device.

In FIG. 2B, the pads 110 and 120 may be spaced apart by the spacing S1. In some embodiments (e.g. semiconductor devices manufactured under a 28 nm process), the spacing S1 may be not greater than 5 µm. The pads 120 and 230 may be spaced apart by the spacing S2. In some embodiments (e.g. semiconductor devices manufactured under a 28 nm process), the spacing S2 may be not greater than 5 µm.

Similar to the semiconductor device 100, the distance may be measured from the left side of the via 232 to the left side of the pad 230 along the width; another distance may be measured from the right side of the via 232 to the right side of the pad 230 along the width. In some embodiments (e.g. semiconductor devices manufactured under a 28 nm process), these two distances may be from 0.9 µm (e.g. width of the pad 230=3.5 µm, width of the via 232=1.7 µm) to 2.5 µm (e.g. width of the pad 230=6 µm, width of the via 232=1 µm). In some embodiments, the ratio of one of these two distances to the width of the via 232 may be from 0.52 (e.g. distance=0.9 µm, width of the via 232=1.7 µm) to 2.5 (e.g. distance=2.5 µm, width of the via 232=1 µm), and passivation cracking between any two of the pads 110, 120, and 230 may be effectively avoided. In some embodiments, the ratio of one of these two distances to the width of the pad 230 may be from 0.25 (e.g. distance=0.9 µm, width of the pad 230=3.5 µm) to 0.42 (e.g. distance=2.5 µm, width of the pad 230=6 µm), and passivation cracking between any two of the pads 110, 120, and 230 may be effectively avoided. When the via 232 is located at the center of the pad 230 along the width, these two distances may be substantially identical.

Figure 3:
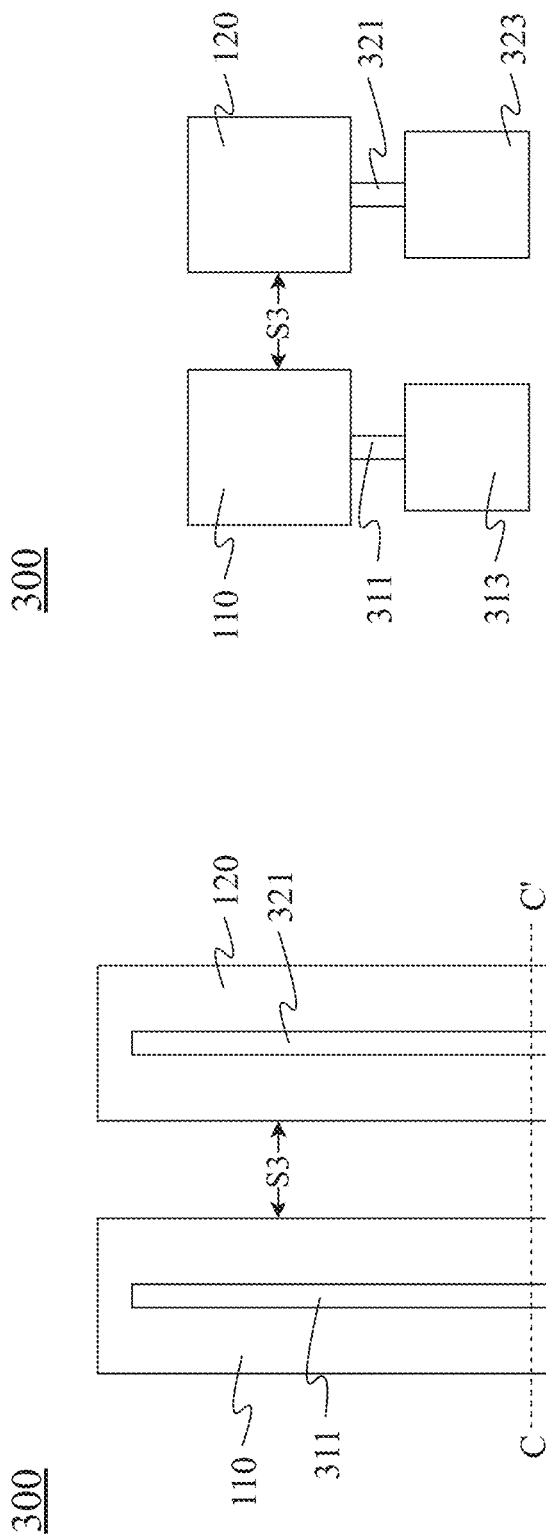
FIG. 3A is a top view of a semiconductor device, in accordance with some embodiments of the present disclosure.
FIG. 3B is a cross-section of the semiconductor device of FIG. 3A along line CC', in accordance with some embodiments of the present disclosure.

FIG. 3A is a diagram of a layout of a semiconductor device 300, in accordance with some embodiments of the present disclosure.

The semiconductor device 300 includes pads 110 and 120 and vias 311 and 321. Compared with the semiconductor device 100 of FIG. 1A, the semiconductor device 300 includes the vias 311 and 321 that are different from the vias 111, 112, 121, and 122 of the semiconductor device 100. The pads 110 and 120 may comprise aluminum, copper, an aluminum copper alloy, the like, or a combination thereof. The vias 311 and 321 may comprise aluminum, copper, an aluminum copper alloy, the like, or a combination thereof. In some embodiments, the pad 110 and via 311 may be formed in a single process (e.g. a deposition process). The pad 120 and via 321 may be formed in a single process (e.g. a deposition process). The pad 110 may connect with the via 311. The pad 120 may connect with the via 321. The via 311 may be formed at a level lower than that of pad 110. The via 321 may be formed at a level lower than that of pad 120.

Similar to the semiconductor device 100, the semiconductor device 300 may be manufactured under a 28 nm process. In some embodiments, the width of the pad 110 may be from 3.5 µm to 6 µm. The width of the pad 120 may be from 3.5 µm to 6 µm. The widths of pads 110 and 120 may be substantially identical. Similar to the semiconductor device 100, the width of the via 311 may be from 1 µm to 1.7 µm; the width of the via 321 may be from 1 µm to 1.7 µm. In an embodiment, the width of the vias 311 and 321 may be 1.7 µm. The widths of the via 311 and 321 may be substantially identical. In some embodiments, when the ratio of the width of the vias to the width of the pads is from 0.16 to 0.48, passivation cracking between two pads may be effectively avoided.

Similar to the semiconductor device 100, the length of the via 311 may be from 5 µm to 30 µm; the length of the via 321 may be from 5 µm to 30 µm. The lengths of the vias 311 and 321 may be substantially identical. In an embodiment, the lengths of the vias 311 and 321 may be 7.2 µm. In some embodiments, when the ratio of the width of the vias to the length of the vias is not greater than 0.34, passivation cracking between the two pads may be effectively avoided.

In FIG. 3A, the pads 110 and 120 may be spaced apart by the spacing S3. In some embodiments (e.g. semiconductor devices manufactured under a 28 nm process), the spacing S3 may be not greater than 5 µm.

FIG. 3B is a cross-section of the semiconductor device 300 of FIG. 3A along line CC', in accordance with some embodiments of the present disclosure.

Similar to the semiconductor device 100, the metal contact 313 may be formed at a level lower than those of the via 311 and the pad 110. The metal contact 323 may be formed at a level lower than those of the via 321 and the pad 120. The pad 110 may be connected to the metal contact 313 through the via 311. The pad 120 may be connected to the metal contact 323 through the via 321. The metal contacts 313 and 323 may comprise copper, aluminum, aluminum copper, tungsten, nickel, the like, or a combination thereof. The metal contacts 313 and 323 may be ultra-thick metal contacts. The metal contacts 313 and 323 may be a part of a top metal layer in a semiconductor device.

In FIG. 3B, the pads 110 and 120 may be spaced apart by the spacing S3. In some embodiments (e.g. semiconductor devices manufactured under a 28 nm process), the spacing S3 may be not greater than 5 µm.

Similar to the semiconductor device 100, the distance may be measured from the left side of the via 311 to the left side of the pad 110 along the width; another distance may be measured from the right side of the via 311 to the right side of the pad 110 along the width. In some embodiments (e.g. semiconductor devices manufactured under a 28 nm process), these two distances may be from 0.9 µm (e.g. width of the pad 110=3.5 µm, width of the via 311=1.7 µm) to 2.5 µm (e.g. width of the pad 110=6 µm, width of the via 311=1 µm). In some embodiments, the ratio of one of these two distances to the width of the via 311 may be from 0.52 (e.g. distance=0.9 µm, width of the via 311=1.7 µm) to 2.5 (e.g. distance=2.5 µm, width of the via 311=1 µm), and passivation cracking between the pads 110 and 120 may be effectively avoided. In some embodiments, the ratio of one of these two distances to the width of the pad 110 may be from 0.25 (e.g. distance=0.9 µm, width of the pad 110=3.5 µm) to 0.42 (e.g. distance=2.5 µm, width of the pad 110=6 µm), and passivation cracking between the pads 110 and 120 may be effectively avoided. When the via 311 is located at the center of the pad 110 along the width, these two distances may be substantially identical.

Similar to the pad 110 and via 311, the distance may be measured from the left side of the via 321 to the left side of the pad 120 along the width; another distance may be measured from the right side of the via 321 to the right side of the pad 120 along the width. In some embodiments (e.g. semiconductor devices manufactured under a 28 nm process), these two distances may be from 0.9 µm (e.g. width of the pad 120=3.5 µm, width of the via 321=1.7 µm) to 2.5 µm (e.g. width of the pad 120=6 µm, width of the via 321=1 µm). In some embodiments, the ratio of one of these two distances to the width of the via 321 may be from 0.52 (e.g. distance=0.9 µm, width of the via 321=1.7 µm) to 2.5 (e.g. distance=2.5 µm, width of the via 321=1 µm), and passivation cracking between the pads 110 and 120 may be effectively avoided. In some embodiments, the ratio of one of these two distances to the width of the pad 120 may be from 0.25 (e.g. distance=0.9 µm, width of the pad 120=3.5 µm) to 0.42 (e.g. distance=2.5 µm, width of the pad 120=6 µm), and passivation cracking between the pads 110 and 120 may be effectively avoided. When the via 321 is located at the center of the pad 120 along the width, these two distances may be substantially identical.

FIG. 4A is a diagram of a layout of a semiconductor device 400, in accordance with some embodiments of the present disclosure.

The semiconductor device 400 includes pads 410 and 420 and vias 411, 412, 414, 421, 422, and 424. Compared with the semiconductor device 100 of FIG. 1A, the pad 410 is associated with three vias 411, 412, and 414; the pad 420 is associated with three vias 421, 422, and 424. The pads 410 and 420 may comprise aluminum, copper, an aluminum copper alloy, the like, or a combination thereof. The vias 411-424 may comprise aluminum, copper, an aluminum copper alloy, the like, or a combination thereof. In some embodiments, the pad 410 and vias 411, 412, and 414 may be formed in a single process (e.g. a deposition process). The pad 420 and vias 421, 422, and 424 may be formed in a single process (e.g. a deposition process). The pad 410 may connect with the vias 411, 412, and 414. The pad 420 may connect with the vias 421, 422, and 424. The vias 411, 412, and 414 may be formed at a level lower than that of pad 410. The vias 421, 422, and 424 may be formed at a level lower than that of pad 420.

Similar to the semiconductor device 100, the semiconductor device 400 may be manufactured under a 28 nm process. In some embodiments, the width of the pad 410 may be from 3.5 µm to 6 µm. The width of the pad 420 may be from 3.5 µm to 6 µm. The widths of pads 410 and 420 may be substantially identical. Similar to the semiconductor device 100, the width of the vias 411, 412, and 414 may be from 1 µm to 1.7 µm; the width of the vias 421, 422, and 424 may be from 1 µm to 1.7 µm. The widths of the vias 411, 412, and 414 may be substantially identical. The widths of the vias 421, 422, and 424 may be substantially identical. The widths of the vias 411, 412, 414, 421, 422, and 424 may be substantially identical. In an embodiment, the width of the vias 411, 412, 414, 421, 422, and 424 may be 1.7 µm. In some embodiments, when the ratio of the width of the vias to the width of the pads is from 0.16 to 0.48, passivation cracking between two pads may be effectively avoided.

Similar to the semiconductor device 100, the length of the pads 410 and 420 may be from 10 µm to 2000 µm. The lengths of the pads 410 and 420 may be substantially identical. When lengths of the pads 410 and 420 are substantially identical and pads 410 and 420 parallel, the parallel run length (PRL) of the pads 410 and 420 may be from 10 µm to 2000 µm.

Similar to the semiconductor device 100, the length of the vias 411, 412, and 414 may be from 5 µm to 30 µm; the length of the vias 421, 422, and 424 may be from 5 µm to 30 µm. The lengths of the vias 311 and 321 may be substantially identical. The lengths of the vias 411, 412, and 414 may be substantially identical. The lengths of the vias 421, 422, and 424 may be substantially identical. The lengths of the vias 411, 412, 414, 421, 422, and 424 may be substantially identical. In an embodiment, the lengths of the vias 411, 412, 414, 421, 422, and 424 may be 7.2 µm. In some embodiments, when the ratio of the width of the vias to the length of the vias is not greater than 0.34, passivation cracking between the two pads may be effectively avoided.

In FIG. 4A, the pads 410 and 420 may be spaced apart by the spacing S4. In some embodiments (e.g. semiconductor devices manufactured under a 28 nm process), the spacing S4 may be not greater than 5 µm.

FIG. 4B is a cross-section of the semiconductor device 400 of FIG. 4A along line DD', in accordance with some embodiments of the present disclosure.

Similar to the semiconductor device 100, the metal contact 413 may be formed at a level lower than those of the via 412 and the pad 410. The metal contact 423 may be formed at a level lower than those of the via 422 and the pad 420. The pad 410 may be connected to the metal contact 413 through the via 412. The pad 420 may be connected to the metal contact 423 through the via 422. The metal contacts 413 and 423 may comprise copper, aluminum, aluminum copper, tungsten, nickel, the like, or a combination thereof. The metal contacts 413 and 423 may be ultra-thick metal contacts. The metal contacts 413 and 423 may be a part of a top metal layer in a semiconductor device.

In FIG. 4B, the pads 410 and 420 may be spaced apart by the spacing S4. In some embodiments (e.g. semiconductor devices manufactured under a 28 nm process), the spacing S4 may be not greater than 5 µm.

Similar to the semiconductor device 100, the distance may be measured from the left side of the via 412 to the left side of the pad 410 along the width; another distance may be measured from the right side of the via 412 to the right side of the pad 410 along the width. In some embodiments (e.g. semiconductor devices manufactured under a 28 nm process), these two distances may be from 0.9 µm (e.g. width of the pad 410=3.5 µm, width of the via 412=1.7 µm) to 2.5 µm (e.g. width of the pad 410=6 µm, width of the via 412=1 µm). In some embodiments, the ratio of one of these two distances to the width of the via 412 may be from 0.52 (e.g. distance=0.9 µm, width of the via 412=1.7 µm) to 2.5 (e.g.

distance=2.5 µm, width of the via 412=1 µm), and passivation cracking between the pads 410 and 420 may be effectively avoided. In some embodiments, the ratio of one of these two distances to the width of the pad 410 may be from 0.25 (e.g. distance=0.9 µm, width of the pad 410=3.5 µm) to 0.42 (e.g. distance=2.5 µm, width of the pad 410=6 µm), and passivation cracking between the pads 410 and 420 may be effectively avoided. When the via 412 is located at the center of the pad 410 along the width, these two distances may be substantially identical.

Similar to the pad 410 and the via 412, the distance may be measured from the left side of the via 422 to the left side of the pad 420 along the width; another distance may be measured from the right side of the via 422 to the right side of the pad 420 along the width. In some embodiments (e.g. semiconductor devices manufactured under a 28 nm process), these two distances may be from 0.9 µm (e.g. width of the pad 420=3.5 µm, width of the via 422=1.7 µm) to 2.5 µm (e.g. width of the pad 420=6 µm, width of the via 422=1 µm). In some embodiments, the ratio of one of these two distances to the width of the via 422 may be from 0.52 (e.g. distance=0.9 µm, width of the via 422=1.7 µm) to 2.5 (e.g. distance=2.5 µm, width of the via 422=1 µm), and passivation cracking between the pads 410 and 420 may be effectively avoided. In some embodiments, the ratio of one of these two distances to the width of the pad 420 may be from 0.25 (e.g. distance=0.9 µm, width of the pad 420=3.5 µm) to 0.42 (e.g. distance=2.5 µm, width of the pad 420=6 µm), and passivation cracking between the pads 410 and 420 may be effectively avoided. When the via 422 is located at the center of the pad 420 along the width, these two distances may be substantially identical.

Figure 5:
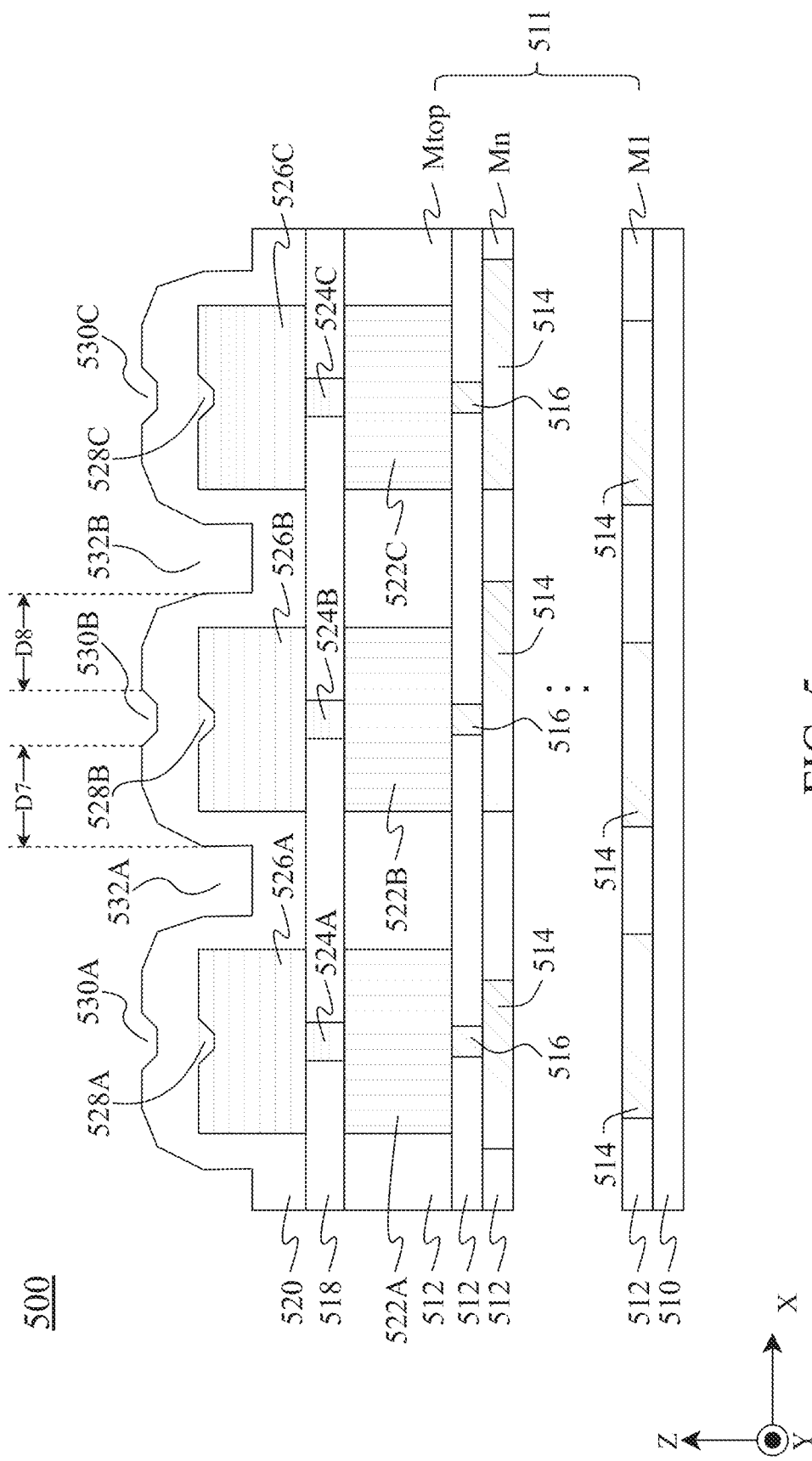
FIG. 5 is a cross-section of a semiconductor device, in accordance with some embodiments of the present disclosure.

FIG. 5 is a cross-section of a semiconductor device 500, in accordance with some embodiments of the present disclosure.

A portion of semiconductor device 500 includes a substrate 510 with an interconnect structure 511, metal contacts 522A, 522B, and 522C, a passivation layer 518, vias 524A, 524B, and 524C, and pads 526A, 526B, and 526C, a passivation layer 520. In this embodiment, the substrate 510 may be silicon. In other embodiments, the substrate 510 may include silicon germanium (SiGe), silicon oxide, nitride, the like, or a combination thereof. The substrate 510 may include integrated circuits comprising active devices and passive devices.

The interconnect structure 511 comprises metal lines 514 and vias 516 to electrically connect the various active devices and/or passive devices to form functional circuitry or an integrated circuit. Conductive materials, such as copper, aluminum, or the like, with or without a barrier layer, can be used as the metal lines 514 and the vias 516. The metal lines 514 and the vias 516 may be formed using a single and/or dual damascene process, via-first process, or metal-first process. Interconnect structure 511 may include a plurality of metal layers, namely M1, Mn, . . . , and Mtop. The metal layer M1 may be the metal layer immediately above the substrate 510. The metal layer Mn may be an intermediate layer above metal layer M1. The metal layer Mtop may be the top metal layer immediately under the vias 524A, 524B, and 524C and pads 526A, 526B, and 526C. Throughout the description, the term "metal layer" may refer to the collection of the metal lines in the same layer. Metal layers M1 through Mn through Mtop may be formed in inter-metal dielectrics (IMDs) layers 512 (or passivation layers), which may be formed of oxides such as silicon oxide, borophosphosilicate glass (BPSG), undoped silicate glass (USG), fluorinated silicate glass (FSG), low-k dielectric materials, the like, or a combination thereof. The low-k dielectric materials may have k values lower than 3.9.

The metal layer Mtop may comprise one or more contacts, such as metal contacts 522A, 522B, and 522C. The metal contacts 522A, 522B, and 522C may be formed over and in electrical contact with the metal layers Mn of the interconnect structure 511. The metal contacts 522A, 522B, and 522C may comprise copper, aluminum, aluminum copper, tungsten, nickel, the like, or a combination thereof. In some embodiments, the metal lines 514 and metal contacts 522A, 522B, and 522C may be formed at a thickness from about 0.3 µm to about 1.2 µm. In other embodiments, the metal layer Mtop and metal contacts 522A, 522B, and 522C may be a top metal or an ultra-thick metal (UTM) formed at a thickness of about 3 times the thickness a typical top metal or about 10 times the thickness of the other metal layers Mn through M1. It is understood, however, that the dimensions recited throughout the description are merely examples, and may be changed in alternative embodiments.

The passivation layer 518 may be formed over the interconnect structure 511 and the metal contacts 522A, 522B, and 522C. In an embodiment, the passivation layer 518 may be formed at a thickness between about 0.7 µm and about 1 µm. After the passivation layer 518 has been formed, one or more openings (e.g. the openings for the vias 524A, 524B, and 524C) may be formed through the passivation layer 518 by removing portions of the passivation layer 518 to expose at least a portion of the underlying metal contacts 522A, 522B, and 522C. The via 524A may allow contact between the metal contact 522A and the pad 526A. The via 524B may allow contact between the metal contact 522B and the pad 526B. The via 524C may allow contact between the metal contact 522C and the pad 526C. The passivation layer 518 may surround the vias 524A, 524B, and 524C. The vias 524A, 524B, and 524C may be formed using a suitable photolithographic mask and etching process, although any suitable process to expose portions of the metal contacts 522A, 522B, and 522C may be used.

After the vias 524A, 524B, and 524C have been formed, the pads 526A, 526B, and 526C may be formed to extend along the passivation layer 518 and may be in electrical connection with the metal contacts 522A, 522B, and 522C. The pads 526A, 526B, and 526C may be utilized to provide electrical connection between the metal contacts 522A, 522B, and 522C and the metal features in layers above the pads 526A, 526B, and 526C. In an embodiment, the pads 526A, 526B, and 526C may comprise aluminum, copper, an aluminum copper alloy, the like, or a combination thereof and may be formed to have a thickness between about 1.4 µm and about 2.8 µm. In some embodiments, the via 524A and the pad 526A may be formed in a single process (e.g. a deposition process). The via 524B and the pad 526B may be formed in a single process (e.g. a deposition process). The via 524C and the pad 526C may be formed in a single process (e.g. a deposition process). In some embodiments, one or more barrier layers (not shown) may be formed at the bottom of the vias 524A, 524B, and 524C comprising titanium, titanium nitride, tantalum, tantalum nitride, the like, or a combination thereof.

The pads 526A and 526B may be spaced apart by a spacing. The pads 526B and 526C may be spaced apart by a spacing. The spacings between pads 526A and 526B and between 526B and 526C may be substantially identical. In some embodiments (e.g. semiconductor devices manufactured under a 28 nm process), the spacings between pads 526A and 526B and between 526B and 526C may be not greater than 5 µm.

After the formation of the pads 526A, 526B, and 526C, the passivation layer 520 may be formed. In an embodiment, the passivation layer 520 may be conformal with substantially the same thickness across the semiconductor device 500. The passivation layer 520 may comprise high density plasma (HDP) oxide (e.g. a layer of oxide formed by a HDP chemical vapor deposition), undoped silicate glass (USG), fluorinated silicate glass (FSG), SiOx, SiN, the like, or a combination thereof. In an embodiment, the passivation layer 520 may be formed to have a thickness between about 1.5 μm and about 2.5 μm or a thickness about 2.2 μm. The passivation layer 520 may surround the pads 526A, 526B, and 526C.

In some embodiments, because pad 526A and via 524A may be formed in a single process, a recess 528A may be formed on the top of the pad 526A. Because pad 526B and via 524B may be formed in a single process, a recess 528B may be formed on the top of the pad 526B. Because pad 526C and via 524C may be formed in a single process, a recess 528C may be formed on the top of the pad 526C.

In FIG. 5, the x-axis may be horizontal, the z-axis may be vertical, and the y-axis may be orthogonal to the plane of the paper. The widths or the radii of the recesses 528A, 528B, and 528C (along the x-axis) may be associated with the widths or the radii (along the x-axis) of the vias 524A, 524B, and 524C, respectively. When the widths or the radii of the vias 524A, 524B, and 524C (along the x-axis) increase, the widths or the radii of the recesses 528A, 528B, and 528C (along the x-axis) may increase correspondingly. When the widths or the radii of the vias 524A, 524B, and 524C (along the x-axis) decrease, the widths or radii of the recesses 528A, 528B, and 528C (along the x-axis) may decrease correspondingly.

The depths (along the z-axis) of the recesses 528A, 528B, and 528C may be associated with the widths or the radii of the vias 524A, 524B, and 524C (along the x-axis), respectively. When the widths or the radii of the vias 524A, 524B, and 524C increase (along the x-axis), the depths of the recesses 528A, 528B, and 528C (along the z-axis) may increase correspondingly.

The depths (along the z-axis) of the recesses 528A, 528B, and 528C may be associated with the lengths of the vias 524A, 524B, and 524C (along the y-axis), respectively. When the lengths of the vias 524A, 524B, and 524C increase (along the y-axis), the depths of the recesses 528A, 528B, and 528C (along the y-axis) may increase correspondingly.

The passivation layer 520 may be conformal with the pads 526A, 526B, and 526C and the passivation layer 518. Recesses 530A, 530B, and 530C on the passivation layer 520 may be formed corresponding to the recesses 528A, 528B, and 528C, respectively.

The widths or radii of the recesses 530A, 530B, and 530C (along the x-axis) may be associated with the widths or radii of the recesses 528A, 528B, and 528C (along the x-axis), respectively. The widths or the radii of the recesses 530A, 530B, and 530C (along the x-axis) may be associated with the widths or the radii (along the x-axis) of the vias 524A, 524B, and 524C, respectively. When the widths or the radii of the vias 524A, 524B, and 524C (along the x-axis) increase, the widths or the radii of the recesses 530A, 530B, and 530C (along the x-axis) may increase correspondingly. When the widths or the radii of the vias 524A, 524B, and 524C (along the x-axis) decrease, the widths or radii of the recesses 530A, 530B, and 530C (along the x-axis) may decrease correspondingly.

Trenches 532A and 532B may be formed on the passivation layer 520. The width of the trench 532A may be associated with the spacing between the pads 526A and 526B. The width of the trench 532B may be associated with the spacing between the pads 526B and 526C. The widths of the trenches 532A and 532B may be associated with the thickness of the passivation 520.

In FIG. 5, a distance D7 may be measured from the left sidewall of the recess 530B to the right sidewall of the trench 532A. A distance D8 may be measured from the right sidewall of the recess 530B to the left sidewall of the trench 532B. Similar distances may be measured with respect to the recesses 530A and 530C and the corresponding trenches.

The distances D7 and D8 may be associated with the widths or radii of the recess 530B (e.g. along the x-axis). The distances D7 and D8 may be associated with the widths or radii of the recesses 528B (e.g. along the x-axis). The distances D7 and D8 may be associated with the widths or radii of the via 524B (e.g. along the x-axis). The distances D7 and D8 may be associated with the distance measured between the boundary of the pad 526B and the boundary of the via 524B on the same side (e.g. distances D3 and D5 shown in FIG. 1B). When the distance D7 and D8 is long enough, passivation cracking (e.g. at the trench 532A or 532B) due to the stress (e.g. the stress may be generated by the change of the temperature) may be avoided. Therefore, the minimal widths of vias 524A, 524B, and 524C may be helpful in avoiding the passivation cracking (e.g. at the trench 532A or 532B).

In some embodiments, when the ratio of the width of the vias 524A, 524B, and 524C (along the x-axis) to the length of the vias 524A, 524B, and 524C (along the y-axis) is not greater than 0.34, the recesses 528A, 528B, and 528C may be narrow or elongate, and the distance D7 and D8 may be long enough. Thus, passivation cracking (e.g. at the trench 532A or 532B) may be effectively avoided.

In some embodiments, when the ratio of the width of the vias (e.g. vias 524A, 524B, and 524C) to the width of the pads (e.g. pads 526A, 526B, and 526C) is from 0.16 to 0.48, passivation cracking (e.g. at the trench 532A or 532B) may be effectively avoided.

Similar to the semiconductor device 100, the distance may be measured from the left side of a via (e.g. one of the vias 524A, 524B, and 524C) to the left side of the corresponding pad along the width; another distance may be measured from the right side of the via to the right side of the corresponding pad along the width. In some embodiments, when the ratio of one of these two distances to the width of the via is from 0.52 to 2.5, passivation cracking (e.g. at the trench 532A or 532B) may be effectively avoided. In some embodiments, the ratio of one of these two distances to the width of the corresponding pad is from 0.25 to 0.42, passivation cracking (e.g. at the trench 532A or 532B) may be effectively avoided.

Table 1 shows the probability of passivation cracking in different cases. The leftmost column shows the different widths of the vias, e.g. the widths of the vias 111, 112, 121, and 122 or the widths of the vias 524A, 524B, and 524C). The second column shows different parallel run lengths, e.g. the lengths of pads 110 and 120 or the lengths the pads 526A, 526B, and 526C. The first row shows different spacings between pads e.g. the spacing of pads 110 and 120 or the spacing the pads 526A, 526B, and 526C. The third to fifth columns show the probability of passivation cracking under different conditions. In general, when the parallel run length increases, the probability increases. When the spacing between pads decreases, the probability may increase. When the width of the vias between pads decreases, the probability may decrease. In some embodiments, even though the width of the vias decreases, the length of the vias may increase to keep the area the same and keep the conductivity unchanged.

TABLE 1

| Width of the vias (μm) | Parallel run length (μm) | Spacing between pads (μm) | | |
|---|---|---|---|---|
| | | 1.8 | 2 | 2.2 |
| 2.7 | 50 | 33.6% | 14.7% | 5.2% |
| | 75 | 40.5% | 24.1% | 14.7% |
| | 100 | 57.8% | 30.2% | 15.5% |
| | 200 | 62.1% | 37.9% | 22.4% |
| | 400 | 73.3% | 52.6% | 39.7 |
| | 500 | 69.8% | 49.1% | 43.1% |
| | 600 | 66.4% | 41.4% | 37.7% |
| 1.5 | 50 | 0.0% | 0.0% | 0.0% |
| | 75 | 0.4% | 0.0% | 0.0% |
| | 100 | 3.9% | 0.4% | 1.3% |
| | 200 | 3.9% | 0.4% | 0.0% |
| | 400 | 6.9% | 3.0% | 0.0% |
| | 500 | 6.5% | 4.3% | 2.6% |
| | 600 | 7.8% | 1.7% | 0.9% |
| 1 | 50 | 0.0% | 0.0% | 0.0% |
| | 75 | 0.9% | 0.0% | 0.0% |
| | 100 | 5.6% | 1.3% | 0.0% |
| | 200 | 9.9% | 3.9% | 0.4% |
| | 400 | 17.2% | 9.1% | 0.4% |
| | 500 | 24.6% | 6.0% | 0.0% |
| | 600 | 16.8% | 8.6% | 0.0% |

FIGS. 6 to 10 illustrate various stages of manufacturing the semiconductor device 500, in accordance with some embodiments of the present disclosure.

Figure 6:
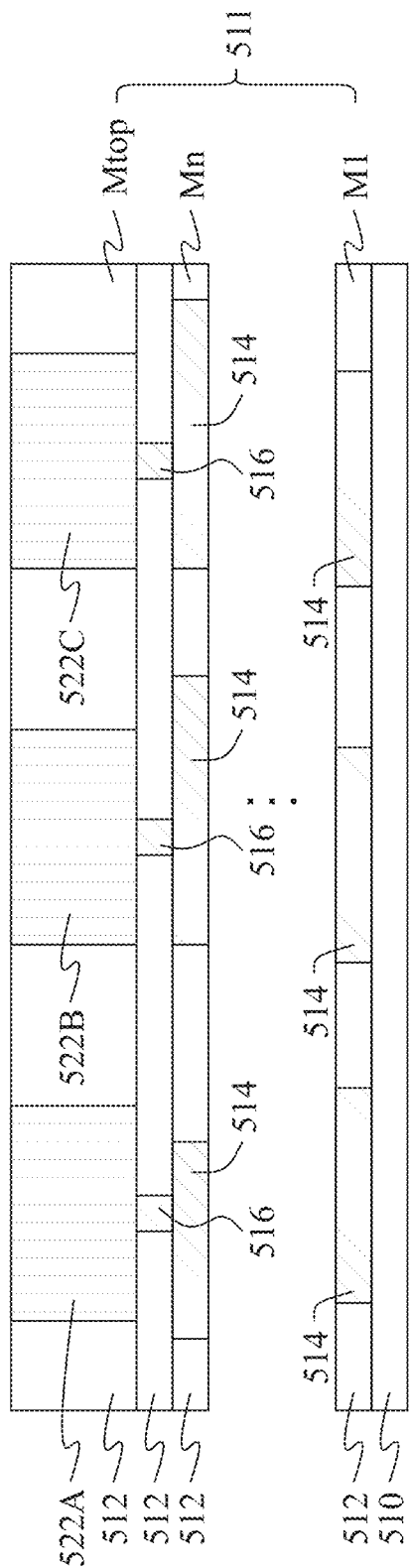
FIGS. 6 to 10 illustrate various stages of manufacturing a semiconductor device, in accordance with some embodiments of the present disclosure.

FIG. 6 illustrates a substrate 510 and metal layers M1 through Mtop at an intermediate stage of processing. The substrate 510 may be silicon, SiGe, silicon carbide, the like, or a combination thereof. The substrate 510 may comprise bulk silicon, doped or undoped, or an active layer of a silicon-on-insulator (SOI) substrate. Other substrates that may be used include multi-layered substrates, gradient substrates, or hybrid orientation substrates.

The substrate 510 may include integrated circuits comprising active and passive devices (not shown). As one of ordinary skill in the art could recognize, a wide variety of active and passive devices such as transistors, capacitors, resistors, combinations of these, or the like may be used to generate the structural and functional requirements of the design for the semiconductor device 500. The integrated circuits comprising active and passive devices may be formed using any suitable methods.

As shown in FIG. 6, the IMDs 512 and metal lines 514 and vias 516 may be formed over the substrate 510. In an embodiment, the metal lines 514 and vias 516 may be coupled to the integrated circuits on the substrate 510 to allow other devices to be coupled to the integrated circuits. Each of the IMDs 512 can be silicon oxide, BPSG, PSG, FSG, the like, or a combination thereof, formed by chemical vapor deposition (CVD), high-density plasma CVD (HDP-CVD), furnace deposition, plasma-enhanced CVD (PECVD), the like, or a combination thereof. The metal lines 514 and vias 516 in each of the IMDs 512 may be formed using, for example, a damascene process like a dual damascene and may comprise aluminum, or copper aluminum alloys, the like, or a combination thereof. The metal lines 514 and the vias 516 may be deposited using, for example, CVD, atomic layer deposition (ALD), physical vapor deposition (PVD), the like, or a combination thereof. A polishing and/or grinding process, such as a chemical mechanical polish (CMP), may remove excess conductive materials. The IMDs 512 may be sequentially formed, along with the respective vias 516 and metal lines 514.

The metal contacts 522A, 522B, and 522C may be formed over the metal lines 514 and vias 516. The metal contacts 522A, 522B, and 522C may comprise copper, aluminum, aluminum copper, tungsten, nickel, the like, or a combination thereof and may be formed by a similar process as the metal lines 514 as described. In another embodiment, the metal contacts 522A, 522B, and 522C may be formed and patterned before the formation of the top IMD 512. The metal contacts 522A, 522B, and 522C may be an UTM formed at a thickness of about 3 times the thickness of a typical top metal or about 10 times the thickness of the other metal layers Mn and M1. In another embodiment, the metal contacts 522A, 522B, and 522C may be a similar thickness to the other metal layers Mn through M1. It should be noted that many other components may be included in an embodiment that are not expressly depicted. For example, etch stop layers can be disposed between the various interfaces between layers of the substrate 510 and IMDs 512. Further, more or fewer IMDs 512 and metal layers may be used.

Figure 7:
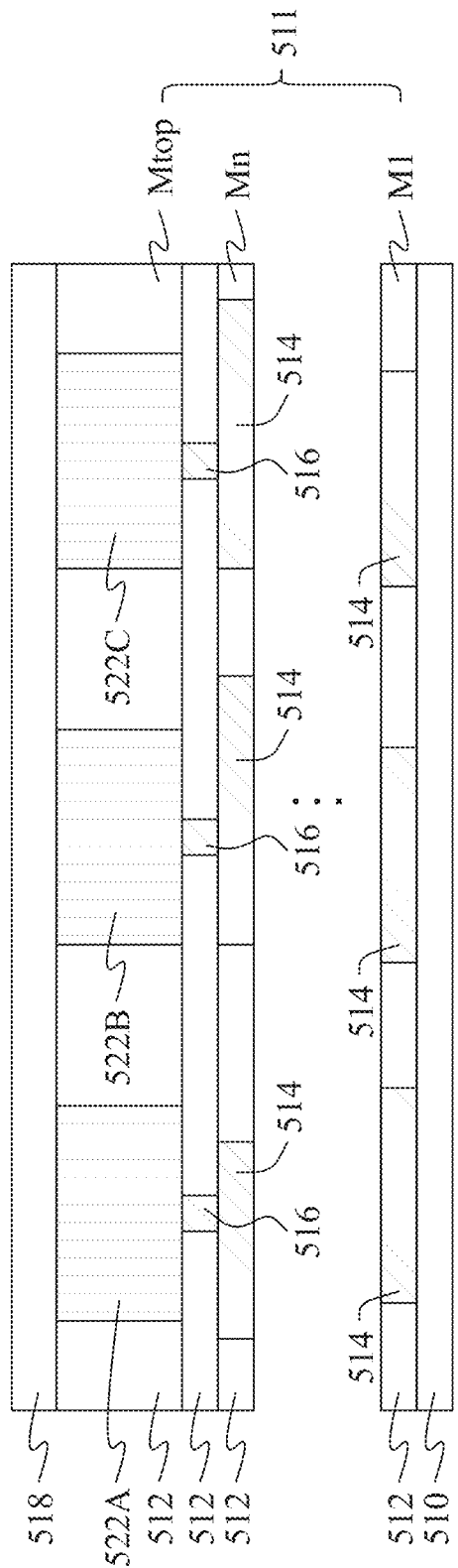

In FIG. 7, the formation of the passivation layer 518 is illustrated. The passivation layer 518 may be formed over the metal contacts 522A, 522B, and 522C and the top IMD 512. The passivation layer 518 can be silicon nitride, silicon carbide, silicon oxide, low-k dielectrics such as carbon doped oxides, extremely low-k dielectrics such as porous carbon doped silicon dioxide, the like, or a combination thereof, and deposited by CVD or the like.

Figure 8:
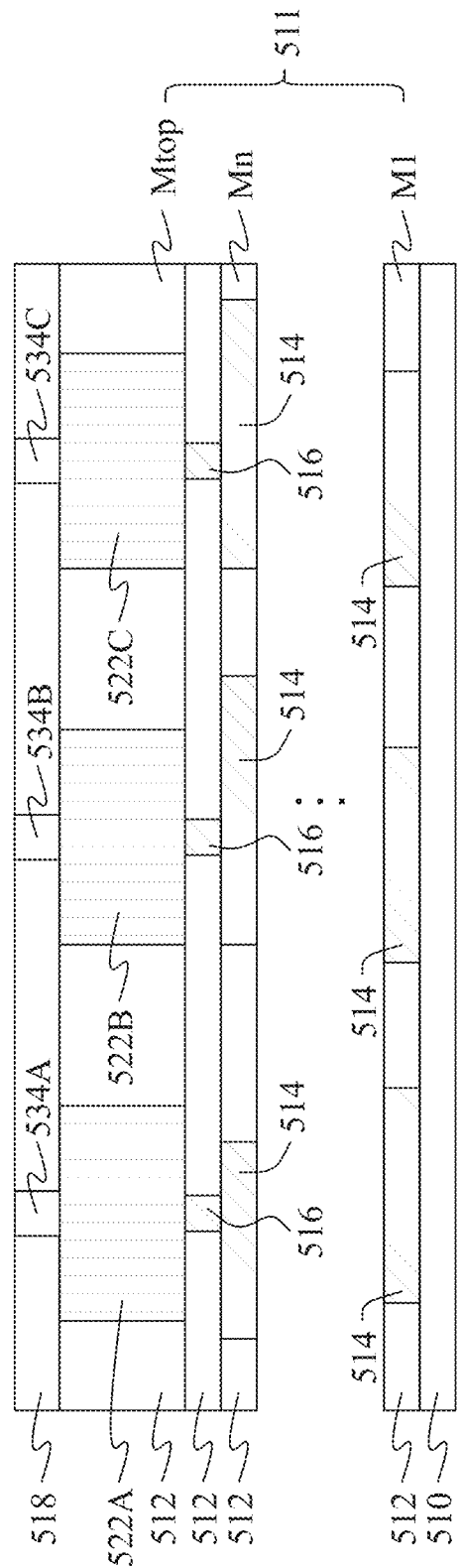

FIG. 8 illustrates the formation of openings 534A, 534B, and 534C on the passivation layer 518. The openings 534A, 534B, and 534C may be formed through the passivation layer 518 by removing portions of the passivation layer 518 to expose at least a portion of the underlying metal contacts 522A, 522B, and 522C. The vias 524A, 524B, and 524C may allow contact to the metal contacts 522A, 522B, and 522C, respectively. The openings 534A, 534B, and 534C may be formed using a suitable photolithographic mask and etching process, although any suitable process to expose portions of the metal contacts 522A, 522B, and 522C may be used.

Figure 9:
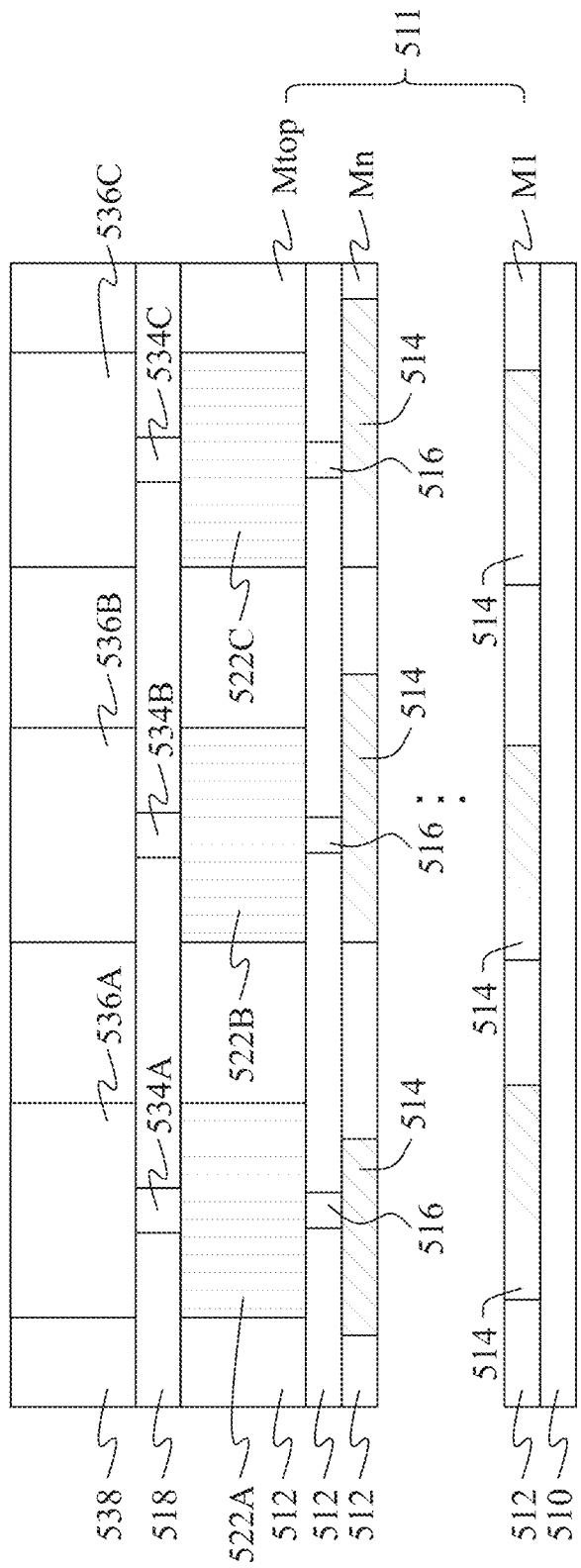

In FIG. 9, openings 536A, 536B, and 536C for the pads 526A, 526B, and 526C may be formed in a photoresist layer 538. The photoresist layer 538 may be removed over the vias 524A, 524B, and 524C and the pads 526A, 526B, and 526C are formed.

In some embodiments, one or more barrier layers (not shown) may be formed at the bottom of the openings 534A, 534B, and 534C comprising titanium, titanium nitride, tantalum, tantalum nitride, the like, or a combination thereof. The one or more barrier layers may be formed along the passivation layer 518 and at the bottom of the openings 534A, 534B, and 534C by CVD, PVD, PECVD, ALD, the like, or a combination thereof. In an embodiment, the photoresist layer 538 may cover a seed layer (not shown) of a titanium copper alloy on one or more barrier layers, if present, through CVD, sputtering, the like, or a combination thereof.

Figure 10:
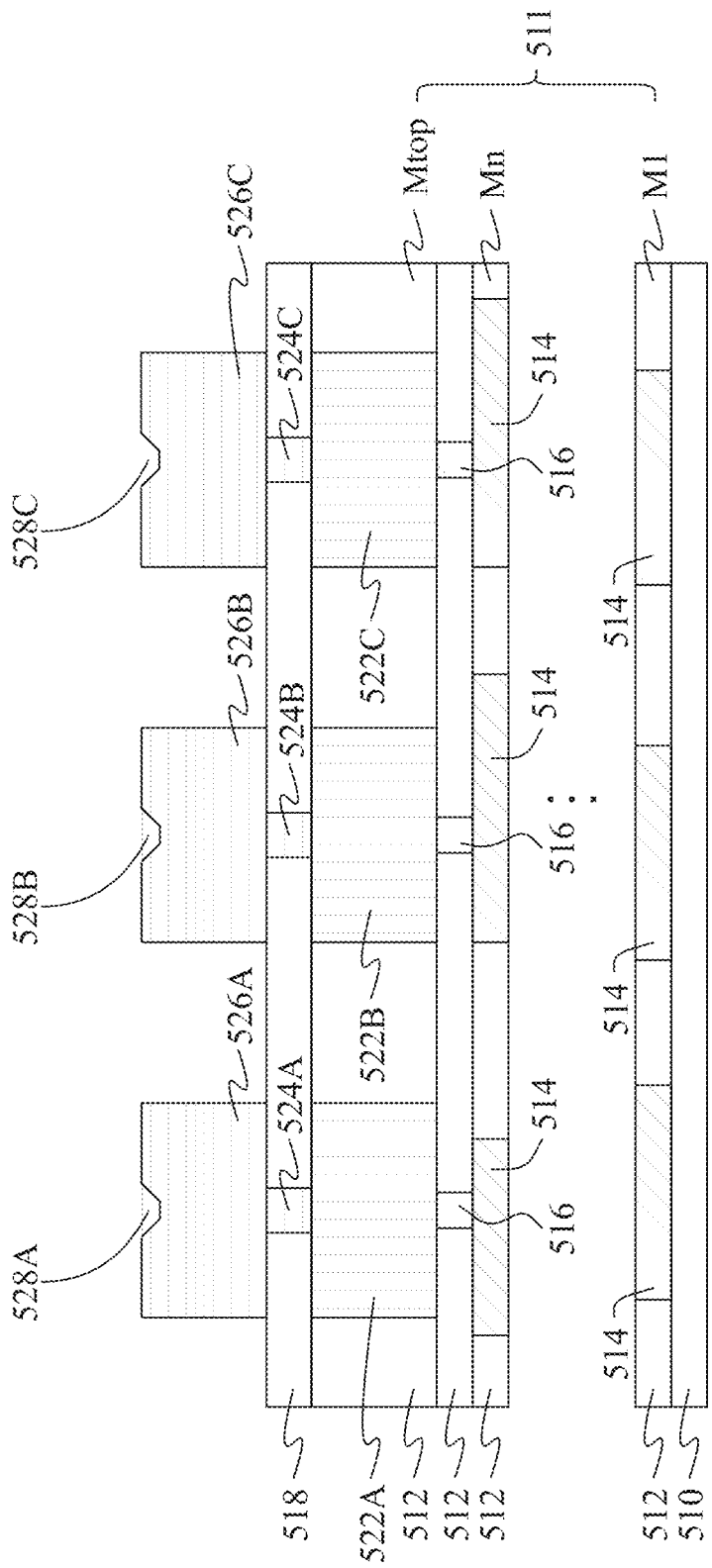

In FIG. 10, the formation of the vias 524A, 524B, and 524C and the pads 526A, 526B, and 526C is illustrated. The vias 524A and pad 526A may be formed in the openings 534A and 536A in a single process (e.g. a deposition process). The vias 524B and pad 526B may be formed in the openings 534B and 536B in a single process (e.g. a deposition process). The vias 524C and pad 526C may be formed in the openings 534C and 536C in a single process (e.g. a deposition process). After the vias 524A, 524B, and 524C and the pads 526A, 526B, and 526C are formed, the photoresist layer 538 may be removed.

In an embodiment, the vias 524A, 524B, and 524C and the pads 526A, 526B, and 526C may be formed by forming a seed layer (not shown) of a titanium copper alloy on the one or more barrier layers, if present, through CVD, sputtering, the like, or a combination thereof. The photoresist layer 538 may then be formed to cover the seed layer, and the photoresist may then be patterned to expose those portions of the seed layer that are located where the pads 526A, 526B, and 526C are desired to be located. Once the photoresist layer 538 has been formed and patterned, a conductive material, such as copper, aluminum, aluminum copper, gold, the like or a combination thereof may be formed on the seed layer through a deposition process such as plating, CVD, PVD, the like, or a combination thereof. Once the conductive material has been formed, the photoresist layer 538 may be removed through a suitable removal process such as ashing. Additionally, after the removal of the photoresist, those portions of the seed layer that were covered by the photoresist may be removed through, for example, a suitable etching process using the conductive material as a mask.

FIG. 10 illustrates the removal of the photoresist layer 538 after the formation of the vias 524A, 524B, and 524C and the pads 526A, 526B, and 526C.

In some embodiments, a ratio of the width of the via 524A to the length of the via 524A may be not greater than 0.34. A ratio of the width of the via 524B to the length of the via 524B may be not greater than 0.34. A ratio of the width of the via 524C to the length of the via 524C may be not greater than 0.34.

In some embodiments, a ratio of the width of the via 524A to the width of the pad 526A may be between 0.16 and 0.48. A ratio of the width of the via 524B to the width of the pad 526B may be between 0.16 and 0.48. A ratio of the width of the via 524C to the width of the pad 526C may be between 0.16 and 0.48.

In some embodiments, along the width of the pad 526A, a first distance may be measured between the boundary of the pad 526A and the boundary of the via 524A on the same side (e.g. on the right side or on the left side). A ratio of the first distance to the width of the via 524A may be between 0.52 and 2.5. A second distance may be measured between the boundary of the pad 526B and the boundary of the via 524B on the same side (e.g. on the right side or on the left side). A ratio of the second distance to the width of the via 524B may be between 0.52 and 2.5. A third distance may be measured between the boundary of the pad 526C and the boundary of the via 524C on the same side (e.g. on the right side or on the left side). A ratio of the third distance to the width of the via 524C may be between 0.52 and 2.5.

After the removal of the photoresist layer 538, the passivation layer 520 may be formed on the pads 526A, 526B, and 526C and the passivation layer 518. The passivation layer 520 may comprise high density plasma (HDP) oxide (e.g. a layer of oxide formed by a HDP chemical vapor deposition), undoped silicate glass (USG), fluorinated silicate glass (FSG), SiOx, SiN, the like, or a combination thereof. The passivation layer 520 may be conformally deposited, by CVD or the like, over the pads 526A, 526B, and 526C and the passivation layer 518 to have the substantially same thickness across the semiconductor device 500. After the passivation layer 520 is formed, the semiconductor device 500 as shown in FIG. 5 may be formed.

Figure 11:
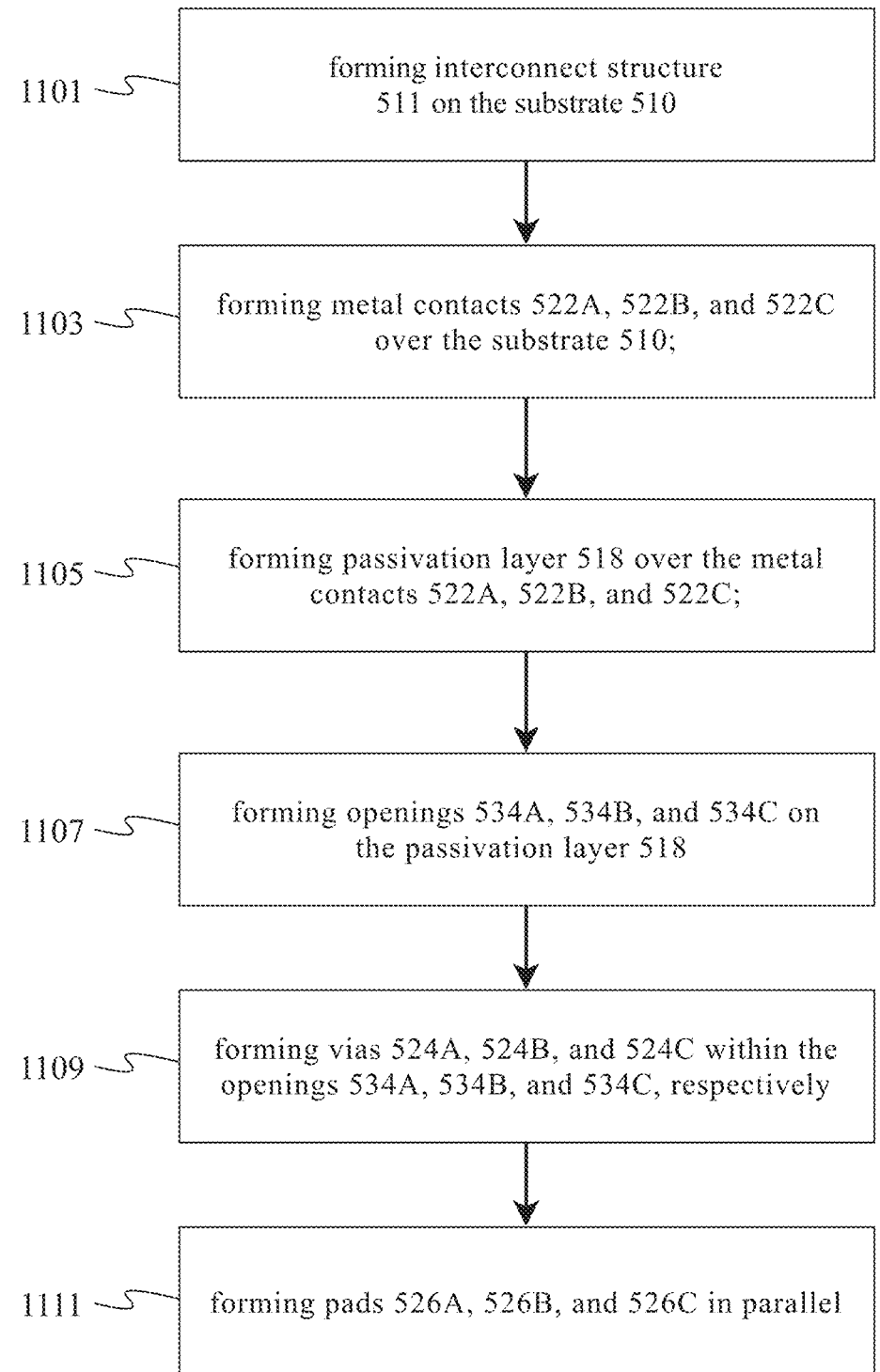
FIG. 11 is a flowchart illustrating a method of manufacturing a semiconductor device, in accordance with some embodiments of the present disclosure.

FIG. 11 is a flowchart illustrating a method 1100 for manufacturing the semiconductor device 500 in accordance with some embodiments of the present disclosure.

In operation 1101, the interconnect structure 511 may be formed on the substrate 510. The interconnect structure 511 comprises metal lines 514 and vias 516 to electrically connect the various active devices and/or passive devices to form functional circuitry or an integrated circuit.

In operation 1103, the metal contacts 522A, 522B, and 522C may be formed over the substrate 510. The metal contacts 522A, 522B, and 522C may be formed over and in electrical contact with the interconnect structure 511.

In operation 1105, the passivation 518 may be formed over the metal contacts 522A, 522B, and 522C. The passivation layer 518 may be formed over the interconnect structure 511 and the metal contacts 522A, 522B, and 522C.

In operation 1107, the openings 534A, 534B, and 534C may be formed on the passivation layer 518. The openings 534A, 534B, and 534C may be formed through the passivation layer 518 by removing portions of the passivation layer 518 to expose at least a portion of the underlying metal contacts 522A, 522B, and 522C.

In operation 1109, the vias 524A, 524B, and 524C may be formed within the openings 534A, 534B, and 534C, respectively. The via 524A may allow contact between the metal contact 522A and the pad 526A. The via 524B may allow contact between the metal contact 522B and the pad 526B. The via 524C may allow contact between the metal contact 522C and the pad 526C. wherein a ratio of the width of the vias 524A, 524B, and 524C to the length of the vias 524A, 524B, and 524C is not greater than 0.34.

In operation 1111, the pads 526A, 526B, and 526C may be formed in parallel. The pad 526A may connect to the metal contact 522A through the via 524A. The pad 526B may connect to the metal contact 522B through the via 524B. The pad 526C may connect to the metal contact 522C through the via 524C. The via 524A and the pad 526A may be formed in a single process (e.g. a deposition process). The via 524B and the pad 526B may be formed in a single process (e.g. a deposition process). The via 524C and the pad 526C may be formed in a single process (e.g. a deposition process).

After the formation of the pads 526A, 526B, and 526C, the passivation layer 520 may be formed. The passivation layer 520 may be conformal and has substantially the same thickness across the semiconductor device 500.

In some embodiments, a ratio of the width of the via 524A to the length of the via 524A may be not greater than 0.34. A ratio of the width of the via 524B to the length of the via 524B may be not greater than 0.34. A ratio of the width of the via 524C to the length of the via 524C may be not greater than 0.34.

In some embodiments, a ratio of the width of the via 524A to the width of the pad 526A may be between 0.16 and 0.48. A ratio of the width of the via 524B to the width of the pad 526B may be between 0.16 and 0.48. A ratio of the width of the via 524C to the width of the pad 526C may be between 0.16 and 0.48.

In some embodiments, along the width of the pad 526A, a first distance may be measured between the boundary of the pad 526A and the boundary of the via 524A on the same side (e.g. on the right side or on the left side). A ratio of the first distance to the width of the via 524A may be between 0.52 and 2.5. A second distance may be measured between the boundary of the pad 526B and the boundary of the via 524B on the same side (e.g. on the right side or on the left side). A ratio of the second distance to the width of the via 524B may be between 0.52 and 2.5. A third distance may be measured between the boundary of the pad 526C and the boundary of the via 524C on the same side (e.g. on the right side or on the left side). A ratio of the third distance to the width of the via 524C may be between 0.52 and 2.5.

Figure 12:
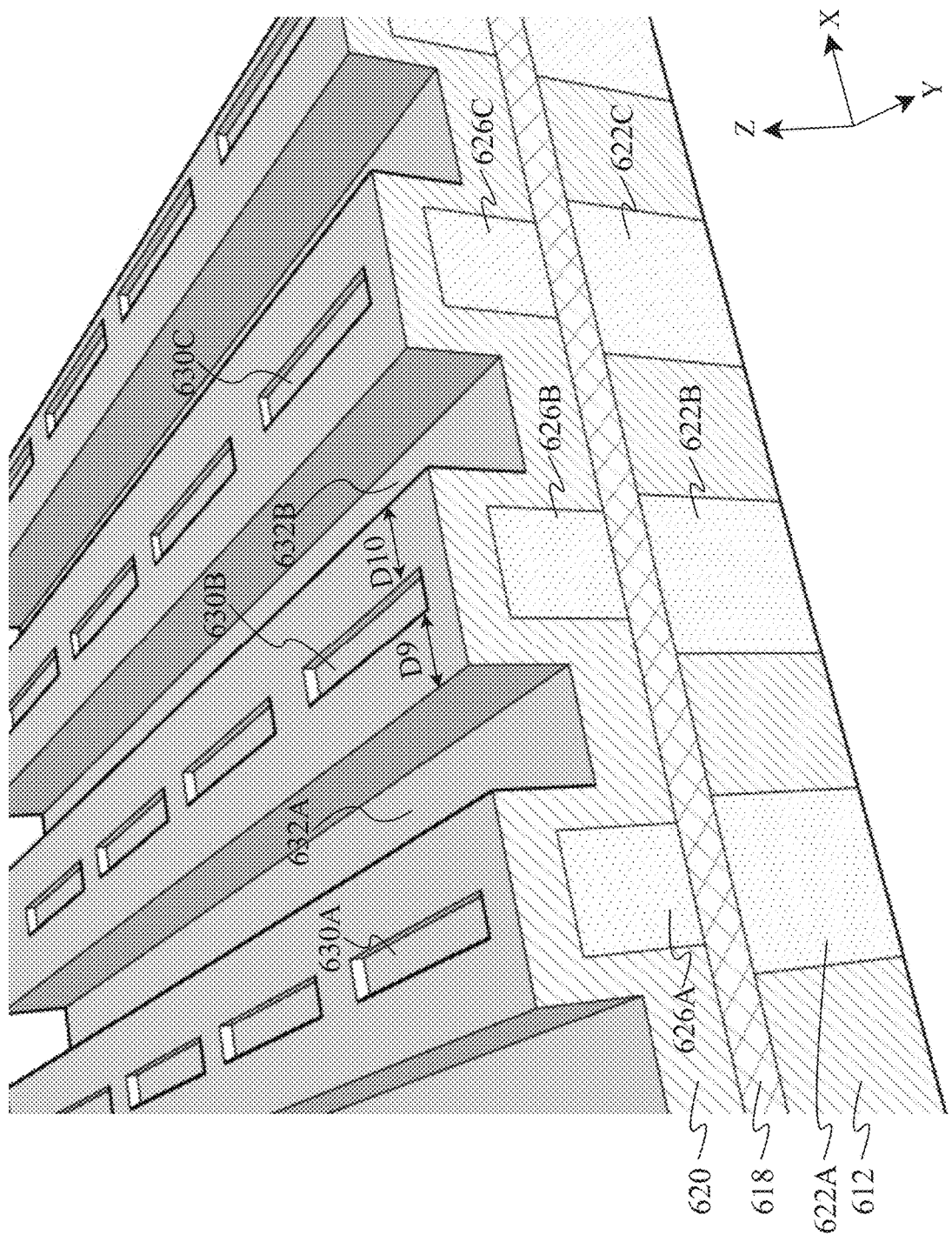
FIG. 12 is a three-dimensional cross-section of a semiconductor device, in accordance with some embodiments of the present disclosure.

FIG. 12 is a three-dimensional cross-section of a semiconductor device 600, in accordance with some embodiments of the present disclosure.

The semiconductor device 600 may include IMD 612, metal contacts 622A, 622B, and 622C, passivation layers 618 and 620, pads 626A, 626B, and 626C, recesses 630A, 630B, and 630C, and trenches 632A and 632B.

The cross-section of FIG. 12 is not cut cross the vias between the pads 626A, 626B, and 626C and the metal contacts 622A, 622B, and 622C, and the vias similar to the vias 524A, 524B, and 524C may be not shown in FIG. 6.

Compared with the semiconductor device 500 shown in FIG. 5, the metal contacts 622A, 622B, and 622C may be similar to the metal contacts 522A, 522B, and 522C. The IMD 612 may be similar to the IMD 512 surrounding the metal contacts 522A, 522B, and 522C. The pads 626A, 626B, and 626C may be similar to the pads 526A, 526B, and 526C. The passivation layer 620 may be similar to the passivation layer 520 surrounding the pads 526A, 526B, and 526C. The passivation layer 618 may be similar to the passivation layer 518 surrounding the vias 524A, 524B, and 524C. The recesses 630A, 630B, and 630C may be similar to the recesses 530A, 530B, and 530C. The trenches 632A and 632B may be similar to the trenches 532A and 532B.

In FIG. 12, a distance D9 may be measured from the left sidewall of the recess 630B to the right sidewall of the trench 632A. A distance D10 may be measured from the right sidewall of the recess 630B to the left sidewall of the trench 632B. Similar distances may be measured with respect to the recess 630A and 630C and the corresponding trenches.

The distances D9 and D10 may be associated with the widths of the recess 630B (e.g. along the x-axis). The distances D9 and D10 may be associated with the widths of the vias (e.g. along the x-axis) between the pads 626A, 626B, and 626C and the metal contacts 622A, 622B, and 622C. The distances D9 and D10 may be associated with the distance measured between the boundary of the pad 626B and the boundary of the underlying via on the same side (e.g. distances D3 and D5 shown in FIG. 1B). When the distance D9 and D10 is large enough, the passivation cracking (e.g. at the trench 632A or 632B) due to the stress (e.g. the stress may be generated because the change of the temperature) may be avoided. Therefore, the minimal widths of vias between the pads 626A, 626B, and 626C may be helpful in avoiding the passivation cracking (e.g. at the trench 632A or 632B).

In some embodiments, for the vias between the pads 626A, 626B, and 626C and the metal contacts 622A, 622B, and 622C, when the ratio of the width of the vias (along the x-axis) to the length of the vias (along the y-axis) is not greater than 0.34, the recesses 630A, 630B, and 630C may be narrow or elongate, and passivation cracking (e.g. at the trench 632A or 632B) may be effectively avoided.

In some embodiments, when the ratio of the width of the vias between the pads 626A, 626B, and 626C and the metal contacts 622A, 622B, and 622C to the width of the pads 626A, 626B, and 626C is from 0.16 to 0.48, passivation cracking (e.g. at the trench 632A or 632B) may be effectively avoided.

Similar to the semiconductor device 100, the distance may be measured from the left side of a via (e.g. the vias between the pads 626A, 626B, and 626C and the metal contacts 622A, 622B, and 622C) to the left side of the corresponding pad along the width; another distance may be measured from the right side of the via to the right side of the corresponding pad along the width. In some embodiments, when the ratio of one of these two distances to the width of the via is from 0.52 to 2.5, passivation cracking (e.g. at the trench 632A or 632B) may be effectively avoided. In some embodiments, the ratio of one of these two distances to the width of the corresponding pad is from 0.25 to 0.42, passivation cracking (e.g. at the trench 632A or 632B) may be effectively avoided.

Figure 13B:
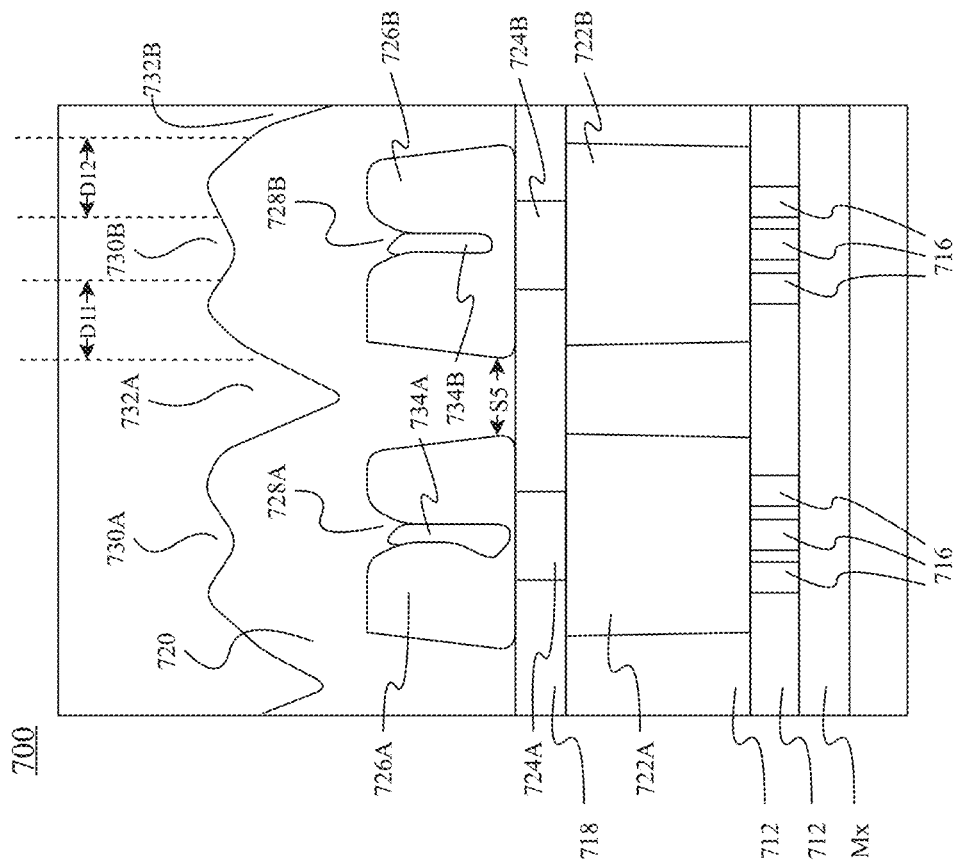
FIG. 13B is a cross-section of the semiconductor device of FIG. 13A along line EE', in accordance with some embodiments of the present disclosure.
Figure 13A:
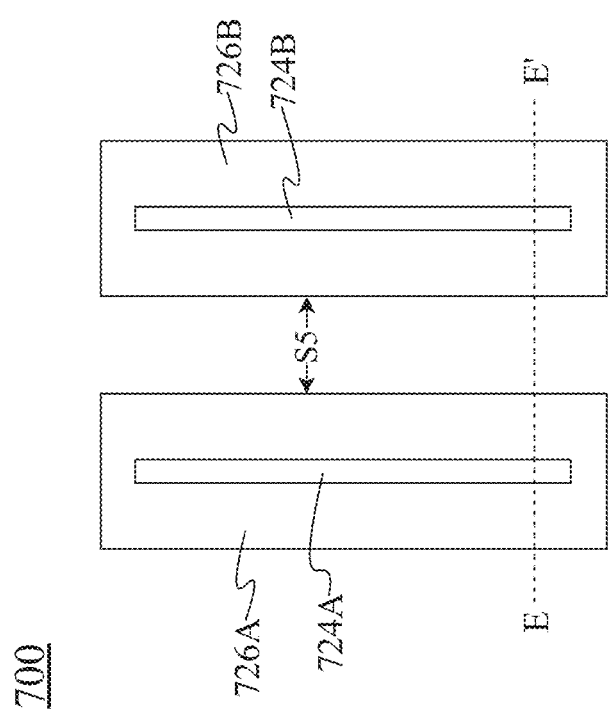
FIG. 13A is a top view of a semiconductor device, in accordance with some embodiments of the present disclosure.

FIG. 13A is a diagram of a layout of a semiconductor device 700, in accordance with some embodiments of the present disclosure.

The semiconductor device 700 may include pads 726A and 726B and vias 724A and 724B. The semiconductor device 700 may be similar to the semiconductor device 300. The pads 726A and 726B may be similar to the pads 110 and 120. The vias 724A and 724B may be similar to the vias 311 and 321. The passivation layers surrounding the pads 726A and 726B and the vias 724A and 724B may be not shown in the FIG. 13A.

In FIG. 13A, the pads 726A and 726B may be spaced apart by the spacing S5. In some embodiments (e.g. semiconductor devices manufactured under a 28 nm process), the spacing S5 maybe not greater than 5 μm.

FIG. 13B is a cross-section of the semiconductor device 700 of FIG. 13A along line EE', in accordance with some embodiments of the present disclosure.

The semiconductor device 700 may include pads 726A and 726B and vias 724A and 724B. The semiconductor device 700 may include a metal layer Mx, IMDs 712, vias 716, metal contacts 722A and 722B, passivation layers 718 and 720, vias 724A and 724B, pads 726A and 726B, recesses 728A, 728B, 730A, and 730B, trenches 732A and 732B, and cavities 734A and 734B.

The semiconductor device 700 may be similar to the semiconductor device 500 shown in FIG. 5. For example, the metal layer Mx may be similar to the metal layer Mn. The IMDs 712 may be similar to the IMDs 512. The vias 716 may be similar to the vias 516. The metal contacts 722A and 722B may be similar to the metal contacts 522A and 522B, respectively. The passivation layers 718 and 720 may be similar to the passivation layers 518 and 520, respectively. The vias 724A and 724B may be similar to the vias 524A and 524B, respectively. The pads 726A and 726B may be similar to the pads 526A and 526B, respectively. The recesses 728A, 728B, 730A, and 730B may be similar to the recesses 528A, 528B, 530A, and 530B, respectively.

In FIG. 13B, the pads 726A and 726B may be spaced apart by the spacing S5. In some embodiments (e.g. semiconductor devices manufactured under a 28 nm process), the spacing S5 maybe not greater than 5 μm.

In some embodiments, because pad 726A and via 724A may be formed in a single process, a trench corresponding to via 724A may be formed in the pad 726A; a portion of the trench not filled with the material of the passivation layer 720 may be formed as the cavity 734A; a portion of the trench filled with the material of the passivation layer 720 may be formed as the recesses 728A. Because pad 726B and via 724B may be formed in a single process, a trench corresponding to via 724B may be formed in the pad 726B; a portion of the trench not filled with the material of the passivation layer 720 may be formed as the cavity 734B; a portion of the trench filled with the material of the passivation layer 720 may be formed as the recesses 728B.

In FIG. 13B, a distance D11 may be measured from the left sidewall of the recess 730B to the right sidewall of the trench 732A. A distance D12 may be measured from the right sidewall of the recess 730B to the left sidewall of the trench 732B. Similar distances may be measured with respect to the recess 730A and the corresponding trenches.

The distances D11 and D12 may be associated with the widths of the recess 730B. The distances D11 and D12 may be associated with the widths or radii of the recesses 728B. The distances D11 and D12 may be associated with the widths of the via 724B. The distances D11 and D12 may be associated with the distance measured between the boundary of the pad 726B and the boundary of the via 724B on the same side (e.g. distances D3 and D5 shown in FIG. 1B). When the distance D11 and D12 is long enough, the passivation cracking (e.g. at the trench 732A or 732B) due to the stress (e.g. the stress may be generated because the change of the temperature) may be avoided. Therefore, the minimal widths of vias 724A and 724B may be helpful in avoiding the passivation cracking (e.g. at the trench 732A or 732B).

In some embodiments, when the ratio of the width of the vias 724A and 724B to the length of the vias 724A and 724B is not greater than 0.34, the recesses 728A, 728B, 730A, and 730B may be narrow or elongate, and the distance D11 and D12 may be long enough. Thus, passivation cracking (e.g. at the trench 732A or 732B) may be effectively avoided.

In some embodiments, when the ratio of the width of the vias (e.g. vias 724A and 724B) to the width of the pads (e.g. pads 726A and 726B) is from 0.16 to 0.48, passivation cracking (e.g. at the trench 532A or 532B) may be effectively avoided.

Similar to the semiconductor device 100, the distance may be measured from the left side of a via (e.g. one of the vias 724A and 724B) to the left side of the corresponding pad along the width; another distance may be measured from the right side of the via to the right side of the corresponding pad along the width. In some embodiments, when the ratio of one of these two distances to the width of the via is from 0.52 to 2.5, passivation cracking (e.g. at the trench 732A or 732B) may be effectively avoided. In some embodiments, the ratio of one of these two distances to the width of the corresponding pad is from 0.25 to 0.42, passivation cracking (e.g. at the trench 732A or 732B) may be effectively avoided.

Figure 14A:
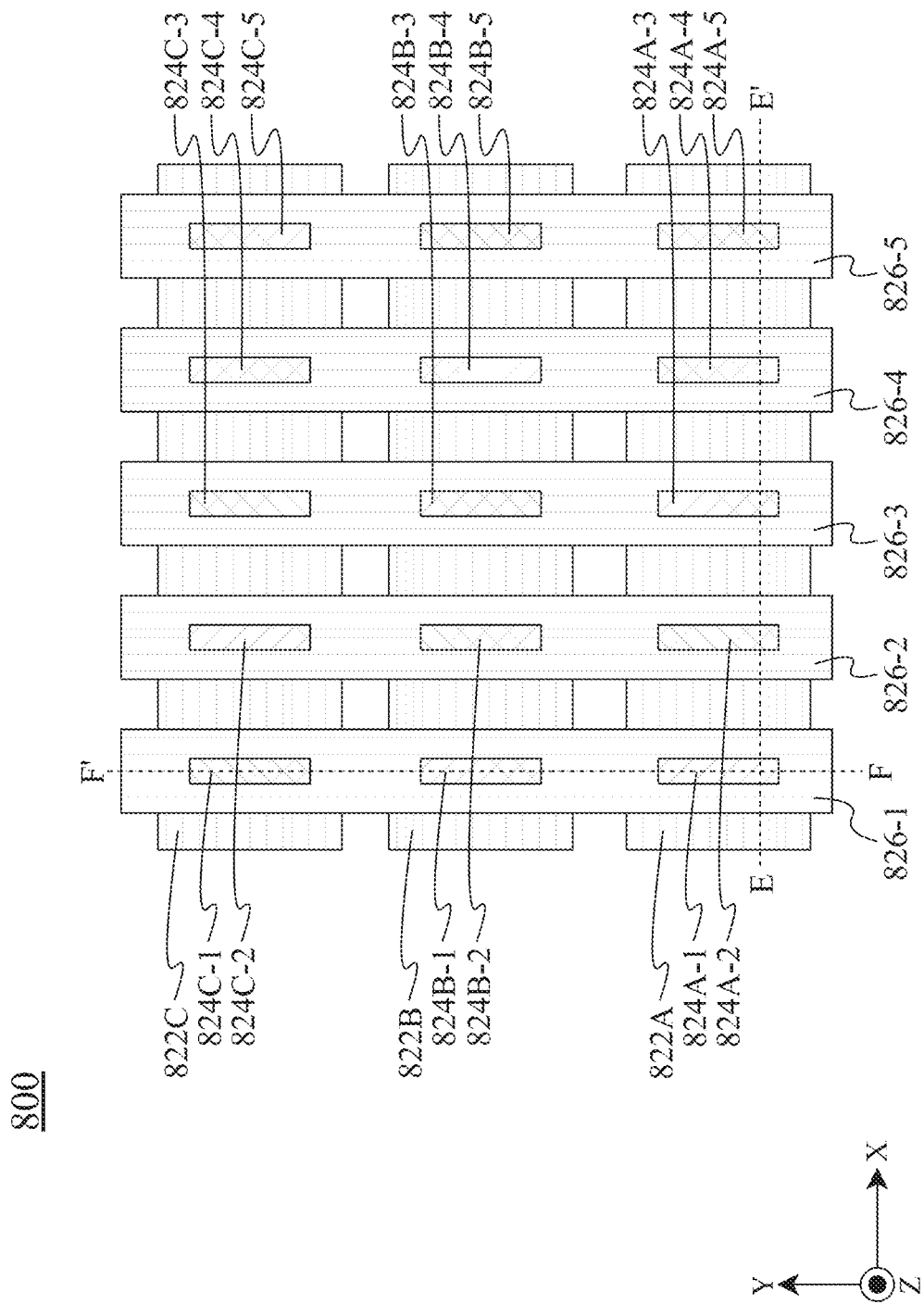
FIG. 14A is a top view of a semiconductor device, in accordance with some embodiments of the present disclosure.

FIG. 14A is a diagram of a layout of a semiconductor device 800, in accordance with some embodiments of the present disclosure. For the purpose of simplicity and clarity, some element of the semiconductor device 800 may not be shown in FIG. 14A. For example, the IMDs 812 and the passivation layers 818 and 820 may not be shown in FIG. 14A.

The semiconductor device 800 may include pads 826-1, 826-2, 826-3, 826-4, and 826-5 and vias 824A-1 to 824A-5, 824B-1 to 824B-5, and 824C-1 to 824C-5. The semiconductor device 800 may include metal contacts 822A, 822B, and 822C.

The pads 826-1, 826-2, 826-3, 826-4, and 826-5 may comprise aluminum, copper, an aluminum copper alloy, the like, or a combination thereof and may be formed to have a thickness between about 1.4 µm and about 2.8 µm. The vias 824A-1 to 824A-5, 824B-1 to 824B-5, and 824C-1 to 824C-5 may comprise aluminum, copper, an aluminum copper alloy, the like, or a combination thereof. The metal contacts 822A, 822B, and 822C may comprise copper, aluminum, aluminum copper, tungsten, nickel, the like, or a combination thereof. In some embodiments, the metal contacts 822A, 822B, and 822C may be formed at a thickness from about 0.3 µm to about 1.2 µm. In some embodiments, the metal contacts 822A, 822B, and 822C may be a top metal or an ultra-thick metal (UTM) formed at a thickness of about 3 times the thickness a typical top metal or about 10 times the thickness of the other metal layers beneath the metal contacts 822A, 822B, and 822C.

In some embodiments, the pads 826-1, 826-2, 826-3, 826-4, and 826-5 and vias 824A-1 to 824A-5, 824B-1 to 824B-5, and 824C-1 to 824C-5 may be formed in a single process (e.g. a deposition process). In some other embodiments, the pad and the corresponding vias under the pad may be formed in a single process (e.g. a deposition process). For example, the pad 826-1 and vias 824A-1, 824B-1, and 824C-1 may be formed in a single process (e.g. a deposition process); and the pad 826-2 and vias 824A-2, 824B-2, and 824C-2 may be formed in a single process (e.g. a deposition process).

In FIG. 14A, the pad may connect with the corresponding vias beneath the pad. For example, the pad 826-1 is landing on and connects with the vias 824A-1, 824B-1, and 824C-1. In FIG. 14A, the metal contact may connect with the corresponding vias over the metal contact. For example, the metal contact 822A may connect with the vias 824A-1 to 824A-5. The vias 824A-1 to 824A-5, 824B-1 to 824B-5, and 824C-1 to 824C-5 may be formed at a level lower than that of pads 826-1, 826-2, 826-3, 826-4, and 826-5. The metal contacts 822A, 822B, and 822C may be formed at a level lower than that of vias 824A-1 to 824A-5, 824B-1 to 824B-5, and 824C-1 to 824C-5.

In FIG. 14A, the pad 826-1 may connect with the metal contact 822A through the via 824A-1. The pad 826-1 may connect with the metal contact 822B through the via 824B-1. The pad 826-1 may connect with the metal contact 822C through the via 824C-1. Furthermore, in the top view, vias 824A-1, 824B-1, and 824C-1 are disposed within the edges of the pad 826-1 with equal margins on opposite sides. Vias 824A-1, 824B-1, and 824C-1 are longitudinally oriented along the Y-direction and aligned along the Y-direction while the pad 826-1 is longitudinally oriented in the Y-direction as well. Vias 824A-1, 824A-2, and 824A-3 are aligned along the X-direction.

The dimensions of the pads 826-1, 826-2, 826-3, 826-4, and 826-5 may be identical or similar to those of pads 110 and 120 shown in FIGS. 1A and 1B. The dimensions of the vias 824A-1 to 824A-5, 824B-1 to 824B-5, and 824C-1 to 824C-5 may be identical or similar to those of vias 111, 112, 121, and 122 shown in FIGS. 1A and 1B. The relationships of the dimensions of the pads 826-1, 826-2, 826-3, 826-4, and 826-5 and the vias 824A-1 to 824A-5, 824B-1 to 824B-5, and 824C-1 to 824C-5 may be identical or similar to those of pads 110 and 120 and vias 111, 112, 121, and 122.

Figure 14B:
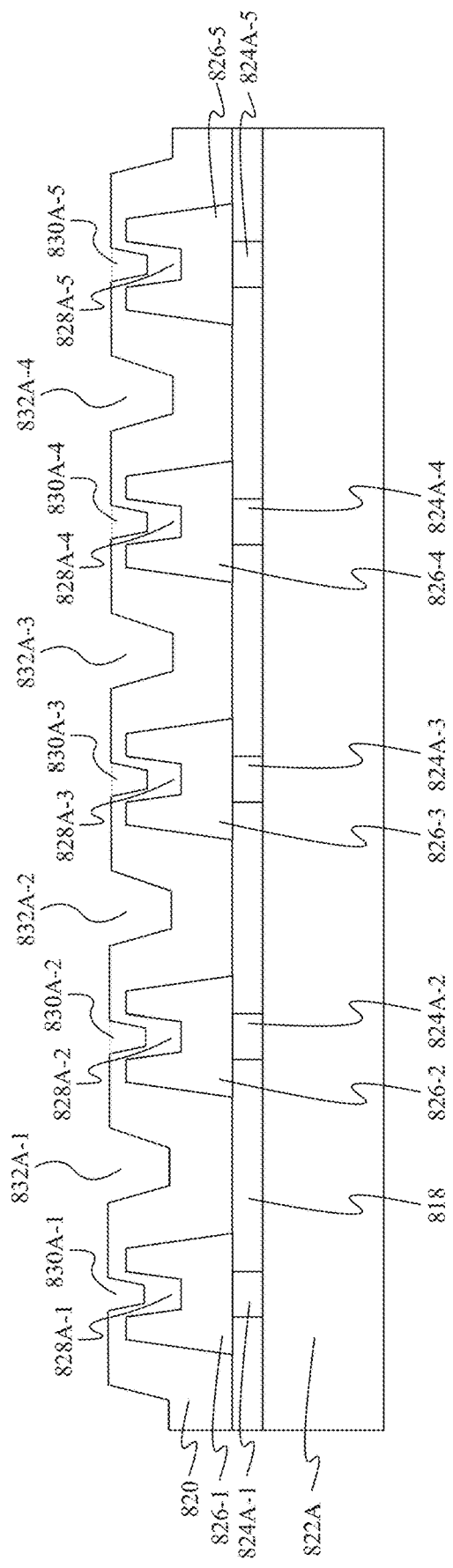
FIG. 14B is a cross-section of the semiconductor device of FIG. 14A along line EE', in accordance with some embodiments of the present disclosure.

FIG. 14B is a cross-section of the semiconductor device 800 of FIG. 14A along line EE', in accordance with some embodiments of the present disclosure.

In FIG. 14B, the semiconductor device 800 may include the metal contact 822A, the vias 824A-1 to 824A-5, the pads 826-1 to 826-5, and the passivation layers 818 and 820. The pad 826-1 connects to the metal contact 822A through the via 824A-1; the pad 826-2 connect to the metal contact 822A through the via 824A-2; the pad 826-3 connect to the metal contact 822A through the via 824A-3; the pad 826-4 connect to the metal contact 822A through the via 824A-4; and the pad 826-5 connect to the metal contact 822A through the via 824A-5.

The metal contact 822A may be similar to metal contact 522A, 522B, or 522C. The metal contact 822A is continuous in FIG. 14B. The operations of forming the vias 824A-1 to 824A-5, the pads 826-1 to 826-5, and the passivation layers 818 and 820 may be identical or similar to those of forming the vias 524A, 524B, 524C, the pads 526A, 526B, 526C, and the passivation layers 518 and 520.

Recesses 828A-1 to 828A-5 may be formed on the top of the pads 826-1 to 826-5, respectively. The causes of the recesses 828A-1 to 828A-5 may be identical or similar to those of the recesses 528A, 528B, and 528C. The dimensions of the recesses 828A-1 to 828A-5 with respect to other elements may be identical or similar to those of the recesses 528A, 528B, and 528C. Recesses 830A-1 to 830A-5 may be formed on the passivation layer 820. The recesses 830A-1 to 830A-5 may correspond to the recesses 828A-1 to 828A-5, respectively. The causes of the recesses 830A-1 to 830A-5 may be identical or similar to those of the recesses 530A, 530B, and 530C. The dimensions of the recesses 830A-1 to 830A-5 with respect to other elements may be identical or similar to those of the recesses 530A, 530B, and 530C.

Trenches 832A-1 to 832A-4 may be formed on the passivation layer 820. The width of the trench 832A-1 may be associated with the spacing between the pads 826-1 and 826-2, and so on. The widths of the trenches 832A-1 to 832A-4 may be associated with the thickness of the passivation 820. The causes of the trenches 832A-1 to 832A-4 may be identical or similar to those of the trenches 532A and 532B. The dimensions of the trenches 832A-1 to 832A-4 with respect to other elements may be identical or similar to those of the trenches 532A and 532B.

Figure 14C:
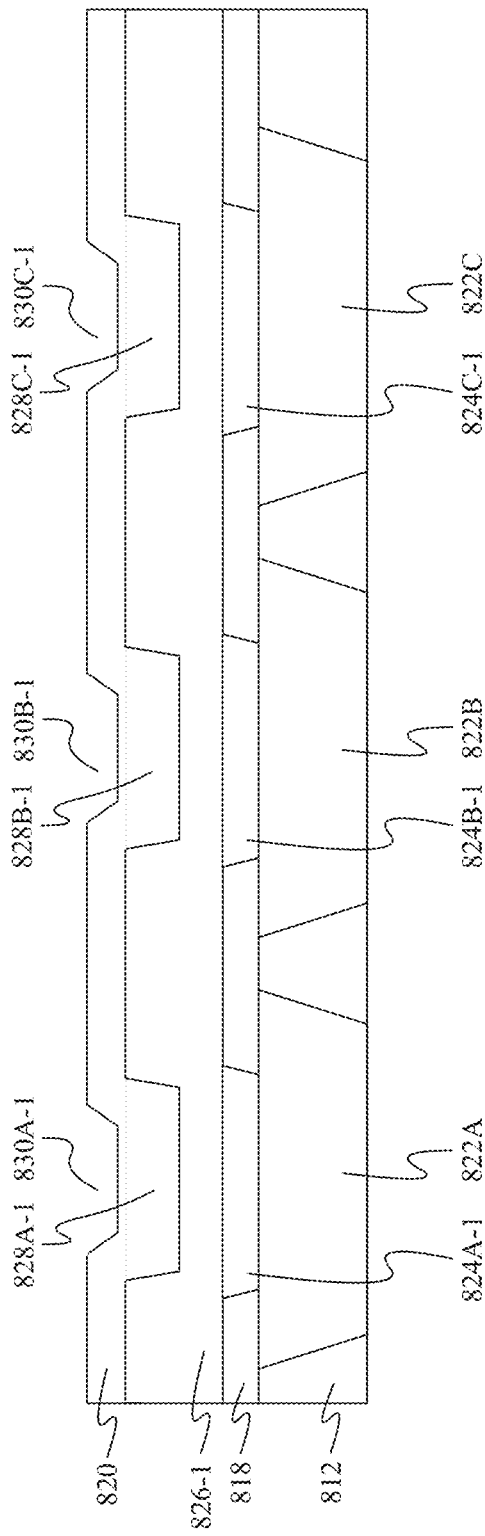
FIG. 14C is a cross-section of the semiconductor device of FIG. 14A along line FF', in accordance with some embodiments of the present disclosure.

FIG. 14C is a cross-section of the semiconductor device 800 of FIG. 14A along line FF', in accordance with some embodiments of the present disclosure.

In FIG. 14C, the semiconductor device 800 may include the metal contacts 822A, 822B, 822C, the vias 824A-1, 824B-1, 824C-1, the pad 826-1, the IMD 812, and the passivation layer 820. The pad 826-1 connects to the metal contact 822A through the via 824A-1; the pad 826-1 connect to the metal contact 822B through the via 824B-1; and the pad 826-1 connect to the metal contact 822C through the via 824C-1.

The metal contacts 822A, 822B, 822C may be similar to metal contact 522A, 522B, or 522C. The pad 826-1 is continuous in FIG. 14C. The operations of forming the vias 824A-1, 824B-1, 824C-1, the pad 826-1, the IMD 812, and the passivation layer 820 may be identical or similar to those of forming the vias 524A, 524B, 524C, the pads 526A, 526B, 526C, the IMD 512, and the passivation layer 520.

Recesses 828A-1, 828B-1, 828C-1 may be formed on the top of the pad 826-1. The causes of the recesses 828A-1, 828B-1, 828C-1 may be identical or similar to those of the recesses 528A, 528B, and 528C. The dimensions of the recesses 828A-1, 828B-1, 828C-1 with respect to other elements may be identical or similar to those of the recesses 528A, 528B, and 528C. Recesses 830A-1, 830B-1, 830C-1 may be formed on the passivation layer 820. The recesses 830A-1, 830B-1, 830C-1 may correspond to the recesses 828A-1, 828B-1, 828C-1, respectively. The causes of the recesses 830A-1, 830B-1, 830C-1 may be identical or similar to those of the recesses 530A, 530B, and 530C. The dimensions of the recesses 830A-1, 830B-1, 830C-1 with respect to other elements may be identical or similar to those of the recesses 530A, 530B, and 530C.

Figure 15A:
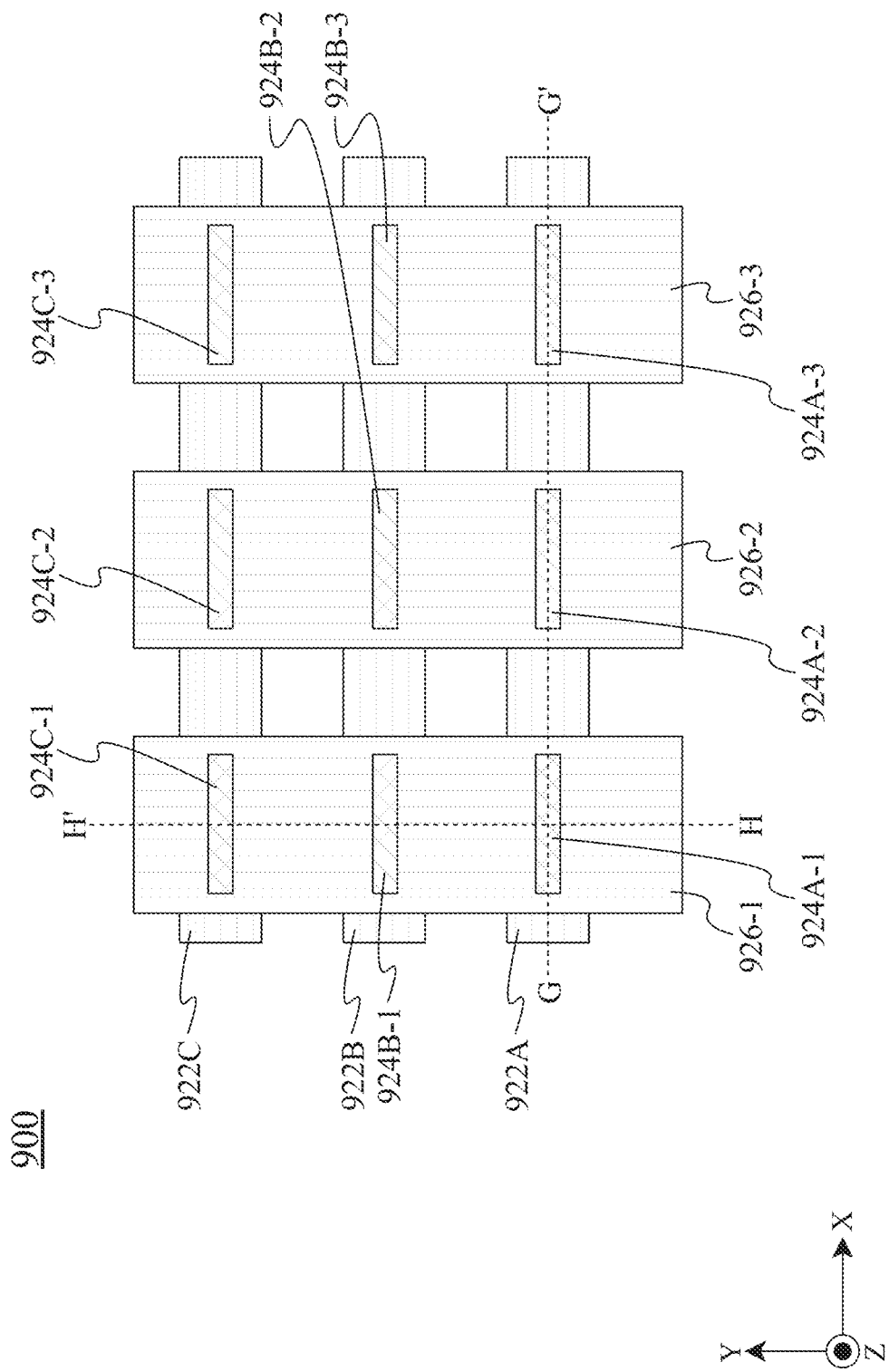
FIG. 15A is a top view of a semiconductor device, in accordance with some embodiments of the present disclosure.

FIG. 15A is a diagram of a layout of a semiconductor device 900, in accordance with some embodiments of the present disclosure. For the purpose of simplicity and clarity, some element of the semiconductor device 900 may not be shown in FIG. 15A. For example, the IMDs 912 and the passivation layers 918 and 920 may not be shown in FIG. 15A.

The semiconductor device 900 may include pads 926-1, 926-2, 926-3 and vias 924A-1 to 924A-3, 924B-1 to 924B-3, and 924C-1 to 924C-3. The semiconductor device 900 may include metal contacts 922A, 922B, and 922C.

The pads 926-1, 926-2, 926-3 may comprise aluminum, copper, an aluminum copper alloy, the like, or a combination thereof and may be formed to have a thickness between about 1.4 µm and about 2.8 µm. The vias 924A-1 to 924A-3, 924B-1 to 924B-3, and 924C-1 to 924C-3 may comprise aluminum, copper, an aluminum copper alloy, the like, or a combination thereof. The metal contacts 922A, 922B, and 922C may comprise copper, aluminum, aluminum copper, tungsten, nickel, the like, or a combination thereof. In some embodiments, the metal contacts 922A, 922B, and 922C may be formed at a thickness from about 0.3 µm to about 1.2 µm. In some embodiments, the metal contacts 922A, 922B, and 922C may be a top metal or an ultra-thick metal (UTM) formed at a thickness of about 3 times the thickness a typical top metal or about 10 times the thickness of the other metal layers beneath the metal contacts 922A, 922B, and 922C.

In FIG. 15A, the longer sides of the vias 924A-1 to 924A-3, 924B-1 to 924B-3, and 924C-1 to 924C-3 are oriented along the direction of the x-axis. The metal contacts 922A, 922B, and 922C may be extended along the direction of the x-axis. Regarding the semiconductor device 800 shown in FIG. 14A, the longer sides of the vias 824A-1 to 824A-5, 824B-1 to 824B-5, and 824C-1 to 824C-5 are oriented along the direction of the y-axis, and the pads 826-1, 826-2, 826-3, 826-4, and 826-5 may be extended along the direction of the y-axis.

In some embodiments, the pads 926-1, 926-2, 926-3 and vias 924A-1 to 924A-3, 924B-1 to 924B-3, and 924C-1 to 924C-3 may be formed in a single process (e.g. a deposition process). In some other embodiments, the pad and the corresponding vias under the pad may be formed in a single process (e.g. a deposition process). For example, the pad 926-1 and vias 924A-1, 924B-1, and 924C-1 may be formed in a single process (e.g. a deposition process); and the pad 926-2 and vias 924A-2, 924B-2, and 924C-2 may be formed in a single process (e.g. a deposition process).

In FIG. 15A, the pad may connect with the corresponding vias beneath the pad. For example, the pad 926-1 is landing on and connects with the vias 924A-1, 924B-1, and 924C-1. Furthermore, in the top view, vias 924A-1, 924B-1, and 924C-1 are disposed within the edges of the pad 926-1 with equal margins on opposite sides. Vias 924A-1, 924B-1, and 924C-1 are aligned along the Y-direction. Vias 924A-1, 924A-2, and 924A-3 are aligned along the X-direction. In FIG. 15A, the metal contact may connect with the corresponding vias over the metal contact. For example, the metal contact 922A may connect with the vias 924A-1 to 924A-3. The vias 924A-1 to 924A-3, 924B-1 to 924B-3, and 924C-1 to 924C-3 may be formed at a level lower than that of pads 926-1, 926-2, 926-3. The metal contacts 922A, 922B, and 922C may be formed at a level lower than that of vias 924A-1 to 924A-3, 924B-1 to 924B-3, and 924C-1 to 924C-3.

In FIG. 15A, the pad 926-1 may connect with the metal contact 922A through the via 924A-1. The pad 926-1 may connect with the metal contact 922B through the via 924B-1. The pad 926-1 may connect with the metal contact 922C through the via 924C-1.

The dimensions of the pads 926-1, 926-2, 926-3 may be identical or similar to those of pads 110 and 120 shown in FIGS. 1A and 1B. The dimensions of the vias 924A-1 to 924A-3, 924B-1 to 924B-3, and 924C-1 to 924C-3 may be identical or similar to those of vias 111, 112, 121, and 122 shown in FIGS. 1A and 1B.

Figure 15B:
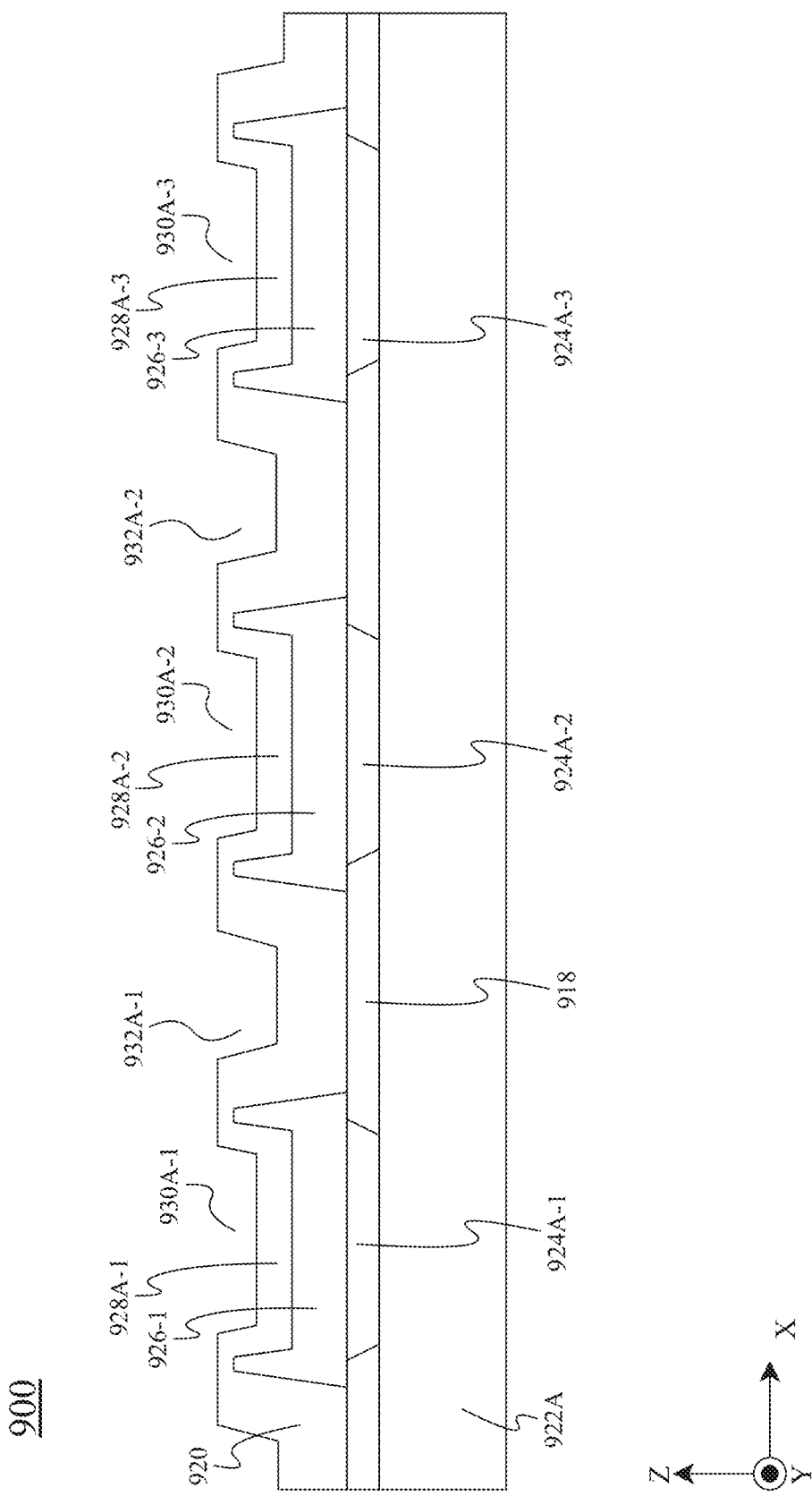
FIG. 15B is a cross-section of the semiconductor device of FIG. 15A along line GG', in accordance with some embodiments of the present disclosure.

FIG. 15B is a cross-section of the semiconductor device 900 of FIG. 15A along line GG', in accordance with some embodiments of the present disclosure.

In FIG. 15B, the semiconductor device 900 may include the metal contact 922A, the vias 924A-1 to 924A-3, the pads 926-1 to 926-3, and the passivation layers 918 and 920. The pad 926-1 connects to the metal contact 922A through the via 924A-1; the pad 926-2 connect to the metal contact 922A through the via 924A-2; and the pad 926-3 connect to the metal contact 922A through the via 924A-3.

The metal contact 922A may be similar to metal contact 522A, 522B, or 522C. The metal contact 922A is continuous in FIG. 15B. The operations of forming the vias 924A-1 to 924A-3, the pads 926-1 to 926-3, and the passivation layers 918 and 920 may be identical or similar to those of forming the vias 524A, 524B, 524C, the pads 526A, 526B, 526C, and the passivation layers 518 and 520.

Recesses 928A-1 to 928A-3 may be formed on the top of the pads 926-1 to 926-3, respectively. The causes of the recesses 928A-1 to 928A-3 may be identical or similar to those of the recesses 528A, 528B, and 528C. The dimensions of the recesses 928A-1 to 928A-3 with respect to other elements may be identical or similar to those of the recesses 528A, 528B, and 528C. Recesses 930A-1 to 930A-3 may be formed on the passivation layer 920. The recesses 930A-1 to 930A-3 may correspond to the recesses 928A-1 to 928A-3, respectively. The causes of the recesses 930A-1 to 930A-3 may be identical or similar to those of the recesses 530A, 530B, and 530C. The dimensions of the recesses 930A-1 to 930A-3 with respect to other elements may be identical or similar to those of the recesses 530A, 530B, and 530C.

Trenches 932A-1 and 932A-2 may be formed on the passivation layer 820. The width of the trench 932A-1 may be associated with the spacing between the pads 926-1 and 926-2, and so on. The widths of the trenches 932A-1 and 932A-2 may be associated with the thickness of the passivation 920. The causes of the trenches 932A-1 and 932A-2 may be identical or similar to those of the trenches 532A and 532B. The dimensions of the trenches 932A-1 and 932A-2 with respect to other elements may be identical or similar to those of the trenches 532A and 532B.

Figure 15C:
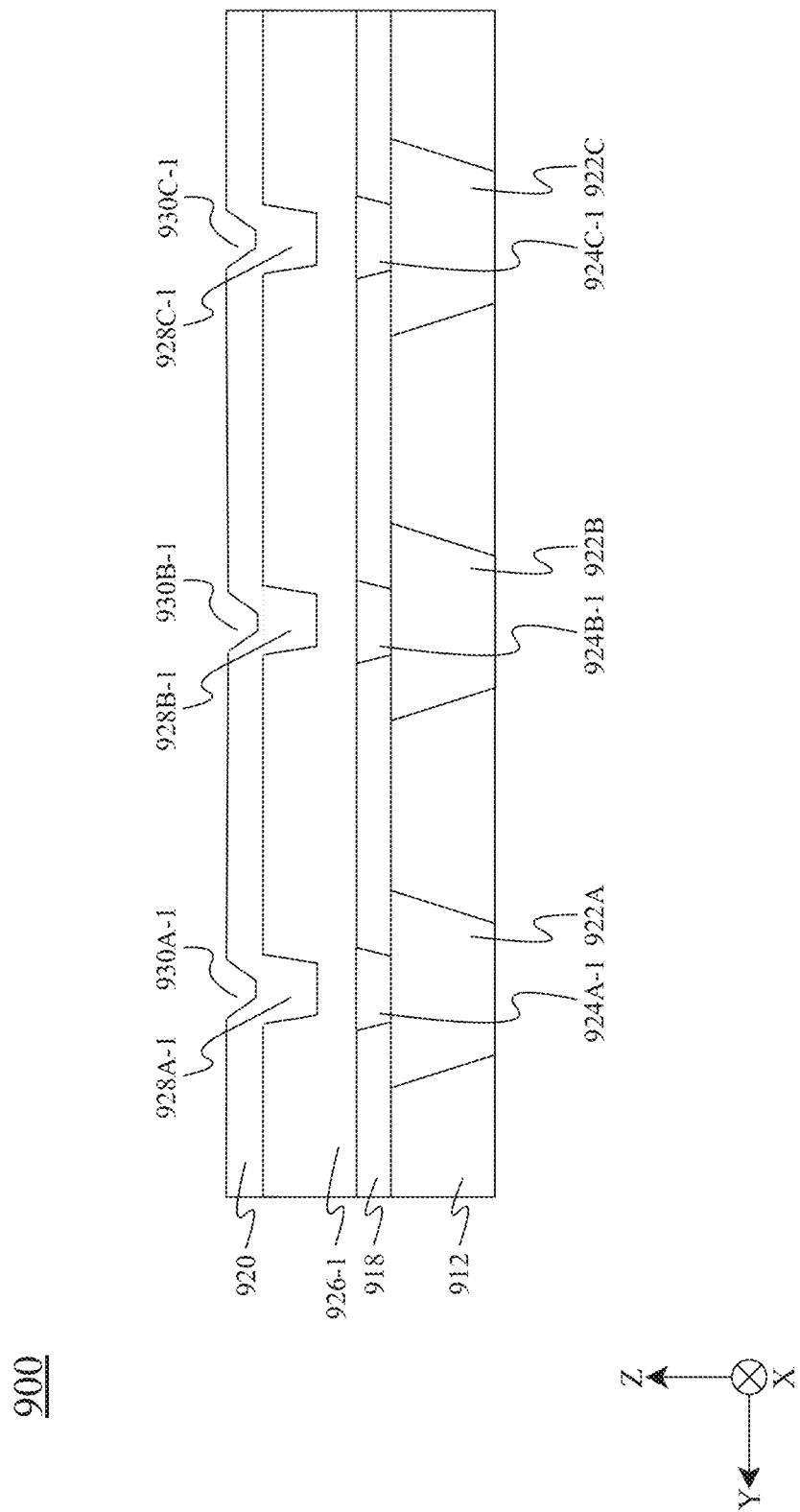
FIG. 15C is a cross-section of the semiconductor device of FIG. 15A along line HH', in accordance with some embodiments of the present disclosure.

FIG. 15C is a cross-section of the semiconductor device 900 of FIG. 15A along line HH', in accordance with some embodiments of the present disclosure.

In FIG. 15C, the semiconductor device 900 may include the metal contacts 922A, 922B, 922C, the vias 924A-1, 924B-1, 924C-1, the pad 926-1, the IMD 912, and the passivation layer 920. The pad 926-1 connects to the metal contact 922A through the via 924A-1; the pad 926-1 connect to the metal contact 922B through the via 924B-1; and the pad 926-1 connect to the metal contact 922C through the via 924C-1.

The metal contacts 922A, 922B, 922C may be similar to metal contact 522A, 522B, or 522C. The pad 926-1 is continuous in FIG. 15C. The operations of forming the vias 924A-1, 924B-1, 924C-1, the pad 926-1, the IMD 912, and the passivation layer 920 may be identical or similar to those of forming the vias 524A, 524B, 524C, the pads 526A, 526B, 526C, the IMD 512, and the passivation layer 520.

Recesses 928A-1, 928B-1, 928C-1 may be formed on the top of the pad 926-1. The causes of the recesses 928A-1, 928B-1, 928C-1 may be identical or similar to those of the recesses 528A, 528B, and 528C. The dimensions of the recesses 928A-1, 928B-1, 928C-1 with respect to other elements may be identical or similar to those of the recesses 528A, 528B, and 528C. Recesses 930A-1, 930B-1, 930C-1 may be formed on the passivation layer 920. The recesses 930A-1, 930B-1, 930C-1 may correspond to the recesses 928A-1, 928B-1, 928C-1, respectively. The causes of the recesses 930A-1, 930B-1, 930C-1 may be identical or similar to those of the recesses 530A, 530B, and 530C. The dimensions of the recesses 930A-1, 930B-1, 930C-1 with respect to other elements may be identical or similar to those of the recesses 530A, 530B, and 530C.

FIG. 16 is a diagram of a layout of a semiconductor device 1000, in accordance with some embodiments of the present disclosure. For the purpose of simplicity and clarity, some element of the semiconductor device 1000 may not be shown in FIG. 16. For example, the IMDs and the passivation layers may not be shown in FIG. 16.

The semiconductor device 1000 may include pads 1026-1, 1026-2, 1026-3, 1026-4 and vias 1024A-1 to 1024A-4, 1024B-1 to 1024B-4, and 1024C-1 to 1024C-4. The semiconductor device 1000 may include metal contact 1022. The metal contact 1022 may include a plurality of elongated portions (e.g., fingers) extended from a main portion of the metal contact 1022.

The pads 1026-1, 1026-2, 1026-3, 1026-4 may comprise aluminum, copper, an aluminum copper alloy, the like, or a combination thereof and may be formed to have a thickness between about 1.4 µm and about 2.8 µm. The vias 1024A-1 to 1024A-4, 1024B-1 to 1024B-4, and 1024C-1 to 1024C-4 may comprise aluminum, copper, an aluminum copper alloy, the like, or a combination thereof. The metal contact 1022 may comprise copper, aluminum, aluminum copper, tungsten, nickel, the like, or a combination thereof. In some embodiments, the metal contact 1022 may be formed at a thickness from about 0.3 µm to about 1.2 µm. In some embodiments, the metal contact 1022 may be a top metal or an ultra-thick metal (UTM) formed at a thickness of about 3 times the thickness a typical top metal or about 10 times the thickness of the other metal layers beneath the metal contact 1022.

In FIG. 16, the longer sides of the vias 1024A-1 to 1024A-4, 1024B-1 to 1024B-4, and 1024C-1 to 1024C-4 may be along the direction of the y-axis, and the pads 1026-1, 1026-2, 1026-3, 1026-4 may be extended along the direction of the y-axis.

In some embodiments, the pads 1026-1, 1026-2, 1026-3, 1026-4 and vias 1024A-1 to 1024A-4, 1024B-1 to 1024B-4, and 1024C-1 to 1024C-4 may be formed in a single process (e.g. a deposition process). In some other embodiments, the pad and the corresponding vias under the pad may be formed in a single process (e.g. a deposition process). For example, the pad 1026-1 and vias 1024A-1, 1024B-1, and 1024C-1 may be formed in a single process (e.g. a deposition process); and the pad 1026-2 and vias 1024A-2, 1024B-2, and 1024C-2 may be formed in a single process (e.g. a deposition process).

In FIG. 16, the pad may connect with the corresponding vias beneath the pad. For example, the pad 1026-1 may connect with the vias 1024A-1, 1024B-1, and 1024C-1. In FIG. 16, the fingers of the metal contact may connect with the corresponding vias over the metal contact. For example, two fingers of the metal contact 1022 may connect with the vias 1024A-1 to 1024A-4. The vias 1024A-1 to 1024A-4, 1024B-1 to 1024B-4, and 1024C-1 to 1024C-4 may be formed at a level lower than that of pads 1026-1, 1026-2, 1026-3, 1026-4. The metal contact 1022 may be formed at a level lower than that of vias 1024A-1 to 1024A-4, 1024B-1 to 1024B-4, and 1024C-1 to 1024C-4.

In FIG. 16, the pad 1026-1 may connect with two fingers of the metal contact 1022 through the via 1024A-1. The pad 1026-2 may connect with another two fingers of the metal contact 1022 through the via 1024B-2.

The dimensions of the pads 1026-1, 1026-2, 1026-3, 1026-4 may be identical or similar to those of pads 110 and 120 shown in FIGS. 1A and 1B. The dimensions of the vias 1024A-1 to 1024A-4, 1024B-1 to 1024B-4, and 1024C-1 to 1024C-4 may be identical or similar to those of vias 111, 112, 121, and 122 shown in FIGS. 1A and 1B.

Figure 17:
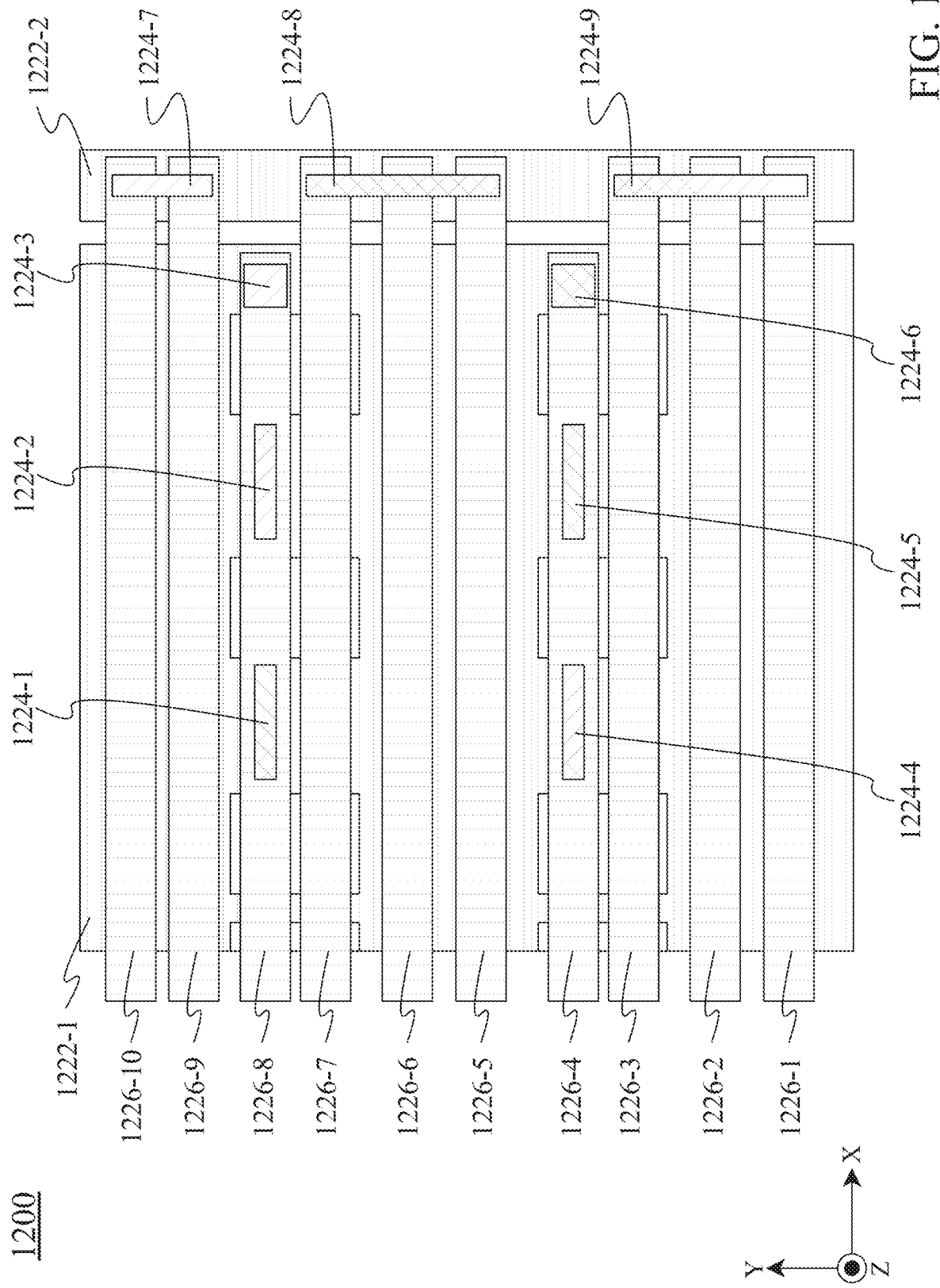
FIG. 17 is a top view of a semiconductor device, in accordance with some embodiments of the present disclosure.

FIG. 17 is a diagram of a layout of a semiconductor device 1200, in accordance with some embodiments of the present disclosure. For the purpose of simplicity and clarity, some element of the semiconductor device 1200 may not be shown in FIG. 17. For example, the IMDs and the passivation layers may not be shown in FIG. 17.

The semiconductor device 1200 may include pads 1226-1 to 1226-10 and vias 1224-1 to 1224-9. The semiconductor device 1200 may include metal contacts 1222-1 and 1222-2. The metal contact 1222-1 may include a plurality of portions.

The pads 1226-1 to 1226-10 may comprise aluminum, copper, an aluminum copper alloy, the like, or a combination thereof and may be formed to have a thickness between about 1.4 µm and about 2.8 µm. The vias 1224-1 to 1224-9 may comprise aluminum, copper, an aluminum copper alloy, the like, or a combination thereof. The metal contacts 1222-1 and 1222-2 may comprise copper, aluminum, aluminum copper, tungsten, nickel, the like, or a combination thereof. In some embodiments, the metal contacts 1222-1 and 1222-2 may be formed at a thickness from about 0.3 µm to about 1.2 µm. In some embodiments, the metal contacts 1222-1 and 1222-2 may be a top metal or an ultra-thick metal (UTM) formed at a thickness of about 3 times the thickness a typical top metal or about 10 times the thickness of the other metal layers beneath the metal contacts 1222-1 and 1222-2.

In FIG. 17, the longer sides of the vias 1224-1, 1224-2, 1224-4, and 1224-5 may be along the direction of the x-axis, and the pads 1226-1 to 1226-10 may be extended along the direction of the x-axis. The longer sides of the vias 1224-7 to 1224-9 may be along the direction of the y-axis, and the metal contact 1222-2 may be extended along the direction of the x-axis.

In some embodiments, the pads 1226-1 to 1226-10 and vias 1224-1 to 1224-9 may be formed in a single process (e.g. a deposition process). In some other embodiments, the pad and the corresponding vias under the pad may be formed in a single process (e.g. a deposition process). For example, the pad 1226-4 and vias 1224-4 to 1224-6 may be formed in a single process (e.g. a deposition process); and the pad 1226-8 and vias 1224-1 to 1224-3 may be formed in a single process (e.g. a deposition process).

In FIG. 17, the pad may connect with the corresponding vias beneath the pad. For example, the pad 1226-4 may connect with the vias 1224-4 to 1224-6. In FIG. 17, the metal contacts may connect with the corresponding vias over the metal contact. For example, portions of the metal contact 1222-1 may connect with the vias 1224-1 to 1224-3, and the metal contact 1222-2 may connect with the vias 1224-7 to 1224-9. The vias 1224-1 to 1224-9 may be formed at a level lower than that of pads 1226-1 to 1226-10. The metal contacts 1222-1 and 1222-2 may be formed at a level lower than that of vias 1224-1 to 1224-9.

In FIG. 17, the pad 1226-4 may connect with portions of the metal contact 1222-1 through the vias 1224-4 to 1224-6. The pad 1226-1 to 1226-3 may connect with the metal contact 1222-2 through the via 1224-9.

The dimensions of the pads 1226-1 to 1226-10 may be identical or similar to those of pads 110 and 120 shown in FIGS. 1A and 1B. The dimensions of the vias 1224-1, 1224-2, 1224-4, 1224-5, and 1224-7 to 1224-9 may be identical or similar to those of vias 111, 112, 121, and 122 shown in FIGS. 1A and 1B.

The top view of the vias 1224-1, 1224-2, 1224-4, 1224-5, and 1224-7 to 1224-9 may be shaped as rectangles each of which has two longer sides and two shorter sides. The ratio of the shorter side to the longer side of one of the vias 1224-1, 1224-2, 1224-4, 1224-5, and 1224-7 to 1224-9 may not greater than 0.34. The top view of the vias 1224-3 and 1224-6 may be shaped as squares, each of which has four identical sides. The area of the rectangle of one of the vias 1224-1, 1224-2, 1224-4, 1224-5, and 1224-7 to 1224-9 may be identical to the area of the square of one of the vias 1224-3 and 1224-6. The conductivity of the vias 1224-1 to 1224-9 may be identical due to the same area.

The present disclosure provides a bonding structure formed in the passivation layer and the method making the same. The bonding structure includes a bonding pad and elongated vias in proper configuration according to various embodiments. By implementing the disclosed semiconductor structure in various embodiments, some of advantages described below may present. However, it is understood that different embodiments disclosed herein offer different advantages and that no particular advantage is necessarily required in all embodiments. As one example, the cracking or delamination is effectively eliminated or reduced while the contact areas of pads to vias are increased, and accordingly contact resistances are reduced.

In one example aspect, the present disclosure provides a semiconductor structure. The semiconductor structure includes an interconnect structure on a substrate; a passivation layer disposed on the interconnect structure; a first via, a second via and a third via disposed in the passivation layer and connected to the interconnect structure, each of the first, second and third vias has an elongated shape longitudinally oriented along a first direction; and a first pad longitudinally oriented along the first direction and landing on the first, second and third vias.

In another example aspect, the present disclosure provides a semiconductor structure that includes an interconnect structure on a substrate; a passivation layer disposed on the interconnect structure; a first via and a second via disposed in the passivation layer and connected to the interconnect structure, each of the first and second vias has an elongated shape longitudinally oriented along a first direction; and a first pad longitudinally oriented along the first direction and landing on the first and second vias.

In yet another example aspect, the present disclosure provides a semiconductor structure that includes an interconnect structure on a substrate; a passivation layer disposed on the interconnect structure; a first via, a second via and a third via disposed in the passivation layer and connected to the interconnect structure, each of the first, second and third vias has an elongated shape longitudinally oriented along a first direction and spaced from each other on a second direction being orthogonal to the first direction; and a first pad longitudinally oriented along the second direction and landing on the first, second and third vias.

The structure reduces the cracking issues without sacrifice of the conductivity. Some embodiments of the present disclosure provide a semiconductor device. The semiconductor device may include a substrate, a first pad, a first metal contact, a first via, a second pad, a second metal contact, and a second via. The first pad may be over the substrate. The first metal contact may be under the first pad. The first via may connect the first pad to the first metal contact. A first ratio of the width of the first via to the width of the first pad may be between 0.16 to 0.48. The second pad may be over the substrate. The second pad may be in parallel with the first pad. The second metal contact may be under the second pad. The second via may connect the second pad to the second metal contact. A second ratio of the width of the second via to the width of the second pad may be between 0.16 to 0.48.

Some embodiments of the present disclosure provide a semiconductor device. The semiconductor device may include a substrate, first to fourth vias, a first passivation layer, a first pad, and a second pad. The first to fourth vias may be over the substrate. The first passivation layer may surround the first via, the second via, the third via, and the fourth via. The first pad may be on the first via and the second via. The first pad may connect to the first via and the second via. The second pad may be in parallel with the first pad. The second pad may be on the third via and the fourth via. The second pad may connect to the third via and the fourth via. A first ratio of the width of the first to fourth vias to the length of the first to fourth vias is not greater than 0.34.

Some embodiments of the present disclosure provide a method of manufacturing a semiconductor device. The method may include: forming an integrated circuit on a substrate; forming a first metal contact and a second metal contact over the substrate; forming a first passivation layer over the first metal contact and the second metal contact; forming a first opening and a second opening on the first passivation layer; forming a first via within the first opening and a second via within the second opening; forming a first pad and a second pad in parallel with the first pad. The first pad may connect to the first metal contact through the first via. The second pad may connect to the second metal contact through the second via. A first ratio of the width of the first and second vias to the length of the first and second vias is not greater than 0.34.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an interconnect structure on a substrate;
a passivation layer disposed on the interconnect structure;
a first via, a second via and a third via disposed in the passivation layer and connected to the interconnect structure, each of the first, second and third vias has an elongated shape longitudinally oriented along a first direction; and
a first pad longitudinally oriented along the first direction and landing on the first, second and third vias, wherein the first and second vias are spaced a distance S along the first direction,
each of the first and second vias spans a first length L1 along the first direction, and
S is less than L1.

2. The semiconductor device of claim 1, wherein the first and second vias are aligned along the first direction.

3. The semiconductor device of claim 1, wherein
each of the first and second vias spans a first width W1 along a second direction being orthogonal to the first direction, a first ratio W1/L1 being equal or less than 0.34; and
the first pad spans a second length L2 along the first direction and a second width W2 along the second direction, a second ratio W2/L2 being equal or less than 0.34.

4. The semiconductor device of claim 3, wherein a third ratio W1/W2 ranges between 0.16 and 0.48.

5. The semiconductor device of claim 3, wherein
the first pad includes a first edge and a second edge oriented along the second direction and a third edge and a fourth edge oriented along the first direction;
the first via includes a fifth edge and a sixth edge oriented along the second direction and a seventh edge and an eighth edge oriented along the first direction; and
the first, second, third and fourth edges are continuously connected and enclosing the fifth, sixth, seventh and eighth edges with a first, second, third and fourth margins, respectively.

6. The semiconductor device of claim 5, wherein
the third margin M3 is defined as a distance between the third and seventh edges; and
a ratio of M3/W1 ranges between 0.52 and 2.5.

7. The semiconductor device of claim 6, wherein
the fourth margin M4 is defined as a distance between the fourth and eighth edges; and
a ratio of M4/W1 ranges between 0.52 and 2.5.

8. The semiconductor device of claim 1, further comprising:
a fourth via, a fifth via and a sixth via disposed in the passivation layer and connected to the interconnect structure, each of the fourth, fifth and sixth vias has an elongated shape longitudinally oriented along the first direction; and
a second pad longitudinally oriented along the first direction and landing on the fourth, fifth and sixth vias.

9. The semiconductor device of claim 8, wherein
the first via and the fourth via are aligned along the second direction;
the second via and the fifth via are aligned along the second direction; and
the third via and the sixth via are aligned along the second direction.

10. A semiconductor device, comprising:
an interconnect structure on a substrate;
a passivation layer disposed on the interconnect structure;
a first via and a second via disposed in the passivation layer and connected to the interconnect structure, each of the first and second vias has an elongated shape longitudinally oriented along a first direction; and
a first pad longitudinally oriented along the first direction and landing on the first and second vias, wherein
the first and second vias are spaced a distance S along the first direction,
each of the first and second vias spans a first length L1 along the first direction, and
the distance S is less than L1.

11. The semiconductor device of claim 10, wherein the first and second vias are aligned along the first direction.

12. The semiconductor device of claim 11, wherein
each of the first and second vias spans a first width W1 along a second direction being orthogonal to the first direction; and
a first ratio W1/L1 is not greater than 0.34.

13. The semiconductor device of claim 12, wherein
the first pad spans a second length L2 along the first direction and a second width W2 along the second direction; and
a second ratio W2/L2 is not greater than 0.34.

14. The semiconductor device of claim 13, wherein a third ratio W1/W2 ranges between 0.16 and 0.48.

15. The semiconductor device of claim 10, further comprising
a third via and a fourth via disposed in the passivation layer and connected to the interconnect structure, each of the third and fourth vias has an elongated shape longitudinally oriented along the first direction; and
a second pad longitudinally oriented along the first direction and landing on the third and fourth vias.

16. The semiconductor device of claim 10, wherein:
along the second direction, a first distance is between the boundary of the first pad and the boundary of the first via on the same side, and
a ratio of the first distance to a width of the first via is between 0.52 and 2.5.

17. A semiconductor device, comprising:
an interconnect structure on a substrate;
a passivation layer disposed on the interconnect structure;
a first via, a second via and a third via disposed in the passivation layer and connected to the interconnect structure, each of the first, second and third vias has an elongated shape longitudinally oriented along a first direction and spaced from each other on a second direction being orthogonal to the first direction; and
a first pad longitudinally oriented along the second direction and landing on the first, second and third vias, wherein
each of the first, second and third vias spans a length Lv along the first direction,
the first pad spans a width Wp along the first direction, and
Lv is less than Wp.

18. The semiconductor device of claim 17, wherein the first, second and third vias are equally distanced along the second direction.

19. The semiconductor device of claim 17, wherein
the first pad includes a first edge and a second edge oriented along the second direction;
each of the first, second and third vias includes a third edge and a fourth edge oriented along the second direction; and
the third and fourth edges are disposed between the first and second edges.

20. The semiconductor device of claim 17, wherein the third and fourth vias are aligned along the first direction.

* * * * *